US012812805B2

(12) United States Patent
Nara et al.

(10) Patent No.: US 12,812,805 B2
(45) Date of Patent: Nov. 24, 2026

(54) COVER, DEVICE OF HUMAN-POWERED VEHICLE, DEVICE OF FISHING TACKLE, AND METHOD FOR MOUNTING COVER TO TARGET PORTION OF ONE OF HUMAN-POWERED VEHICLE AND FISHING TACKLE

(71) Applicant: SHIMANO INC., Sakai City (JP)

(72) Inventors: Tomoaki Nara, Sakai City (JP); Kazutaka Fukao, Sakai City (JP); Masaaki Sunaga, Sakai City (JP); Eri Kinoshita, Sakai City (JP); Yuma Yamamoto, Sakai City (JP)

(73) Assignee: SHIMANO INC., Sakai (JP)

( * ) Notice: Subject to any disclaimer, the term of this patent is extended or adjusted under 35 U.S.C. 154(b) by 214 days.

(21) Appl. No.: 18/739,265

(22) Filed: Jun. 10, 2024

(65) Prior Publication Data

US 2025/0380371 A1 Dec. 11, 2025

(51) Int. Cl.

| | |
|---|---|
| ***H05K 5/03*** | (2006.01) |
| ***A01K 97/06*** | (2006.01) |
| ***B62J 23/00*** | (2006.01) |

(52) U.S. Cl.

CPC ............... *H05K 5/03* (2013.01); *A01K 97/06* (2013.01); *B62J 23/00* (2013.01)

(58) Field of Classification Search

CPC ............ H05K 5/03; A01K 97/06; B62J 23/00
USPC .......................................................... 428/131
See application file for complete search history.

(56) References Cited

U.S. PATENT DOCUMENTS

| | | | | |
|---|---|---|---|---|
| 4,628,628 A * | 12/1986 | Burgin | A01K 97/08 | 224/616 |
| 6,209,816 B1 * | 4/2001 | Hitomi | C23F 15/00 | 242/310 |
| 6,790,535 B2 * | 9/2004 | Nishimura | B05D 7/04 | 242/223 |
| 10,465,139 B2 * | 11/2019 | Asakawa | C23C 30/00 | |
| 11,274,260 B2 * | 3/2022 | Asakawa | C23C 28/025 | |
| 11,856,920 B1 * | 1/2024 | Pahl | A01K 97/06 | |
| 2004/0041046 A1 * | 3/2004 | Nishimura | B44C 3/02 | 242/310 |

FOREIGN PATENT DOCUMENTS

| | | | |
|---|---|---|---|
| CN | 106234327 A * | 12/2016 | A01K 97/00 |
| JP | 2019-035385 | 3/2019 | |
| JP | 3240829 U | 2/2023 | |
| WO | WO 2018/037866 | 3/2018 | |

OTHER PUBLICATIONS

Machine_English_translation_CN_106234327_A; Kazuma et al.; Fish line guiding member; Dec. 21, 2016; whole document (Year: 2026).*

* cited by examiner

*Primary Examiner* — Tahseen Khan
(74) *Attorney, Agent, or Firm* — MORI & WARD, LLP

(57) ABSTRACT

A cover comprises a cover body. The cover body is configured to be mounted to a target portion of one of a human-powered vehicle and a fishing tackle. The cover body is configured to define at least one interior cavity. The cover body includes: at least one adhesive applied portion to which adhesive is to be applied; and at least one hole configured to be connected to the at least one interior cavity.

23 Claims, 28 Drawing Sheets

COVER, DEVICE OF HUMAN-POWERED VEHICLE, DEVICE OF FISHING TACKLE, AND METHOD FOR MOUNTING COVER TO TARGET PORTION OF ONE OF HUMAN-POWERED VEHICLE AND FISHING TACKLE

BACKGROUND

Technical Field

The present invention relates to a cover, a device of a human-powered vehicle, a device of a fishing tackle, and a method for mounting a cover to a target portion of one of the human-powered vehicle and the fishing tackle.

Background Information

One of a human-powered vehicle and a fishing tackle includes a device including a component. The device includes a cover member to cover the component. The cover includes an interior cavity in which the component is to be provided. For example, the cover member is attached to a target portion of the device with a bonding structure such as adhesive. The inner pressure of the interior cavity may increase when the cover is attached to the target portion. The increase in the inner pressure may impact the state of the adhesive. One of objects of the present disclosure is to reduce or prevent the impact of the inner pressure on the state of the adhesive.

SUMMARY

In accordance with a first aspect of the present invention, a cover comprises a cover body. The cover body is configured to be mounted to a target portion of one of a human-powered vehicle and a fishing tackle. The cover body is configured to define at least one interior cavity. The cover body includes: at least one adhesive applied portion to which adhesive is to be applied; and at least one hole configured to be connected to the at least one interior cavity.

With the cover according to the first aspect, the at least one hole allows air to flow between the at least one interior cavity and an outside of the cover body when the cover body is mounted to the target portion in a state where adhesive is applied to the at least one adhesive applied portion. Thus, it is possible to reduce or prevent an increase in inner pressure of the at least one interior cavity when the cover body is mounted to the target portion. Accordingly, the at least one hole can reduce or prevent the impact of the inner pressure on the state of the adhesive.

In accordance with a second aspect of the present invention, the cover according to the first aspect is configured so that the cover body has a distal section configured to be attached to the target portion of one of the human-powered vehicle and the fishing tackle. The distal section of the cover body has the at least one adhesive applied portion. The distal section of the cover body has an interior surface and an exterior surface. The interior surface faces toward the at least one interior cavity. The exterior surface is provided on a reverse side of the interior surface. The distal section of the cover body has at least one first protrusion extending in at least one of a first direction defined from the interior surface toward the exterior surface and a second direction defined from the exterior surface toward the interior surface.

With the cover according to the second aspect, the at least one first protrusion can make a region of the at least one adhesive applied portion wider.

In accordance with a third aspect of the present invention, the cover according to the second aspect is configured so that the at least one first protrusion extends in the first direction. The at least one adhesive applied portion is provided to the at least one first protrusion. The at least one hole is disposed closer to the at least one interior cavity than the at least one adhesive applied portion.

With the cover according to the third aspect, the at least one hole reliably allows air to flow between the at least one interior cavity and the outside of the cover body when the cover body is mounted to the target portion in a state where adhesive is applied to the at least one adhesive applied portion. Thus, the at least one hole can reliably reduce or prevent the impact of the inner pressure on the state of the adhesive.

In accordance with a fourth aspect of the present invention, the cover according to the second or third aspect is configured so that the at least one first protrusion extends in the first direction. The at least one hole is at least partly provided to the at least one first protrusion.

With the cover according to the fourth aspect, the at least one hole reliably allows air to flow between the at least one interior cavity and the outside of the cover body when the cover body is mounted to the target portion in a state where adhesive is applied to the at least one adhesive applied portion. Thus, the at least one hole can reliably reduce or prevent the impact of the inner pressure on the state of the adhesive.

In accordance with a fifth aspect of the present invention, the cover according to any one of the first to fourth aspects is configured so that the cover body includes a base wall and at least one additional wall. The at least one additional wall extends from the base wall so that the at least one interior cavity is defined by the base wall and the at least one additional wall. The at least one additional wall has a proximal section and a distal section. The proximal section of the at least one additional wall is connected to the base wall. The distal section of the at least one additional wall has the at least one adhesive applied portion.

With the cover according to the fifth aspect, the base wall and the at least one additional wall reliably define the at least one interior cavity.

In accordance with a sixth aspect of the present invention, the cover according to the fifth aspect is configured so that the at least one additional wall has an interior surface and an exterior surface. The interior surface faces toward the at least one interior cavity. The exterior surface is provided on a reverse side of the interior surface. The distal section of the at least one additional wall has at least one first protrusion. The at least one first protrusion extends in at least one of a first direction defined from the interior surface toward the exterior surface and a second direction defined from the exterior surface toward the interior surface.

With the cover according to the sixth aspect, the at least one first protrusion can make a region of the at least one adhesive applied portion wider.

In accordance with a seventh aspect of the present invention, the cover according to the sixth aspect is configured so that the at least one first protrusion extends in the first direction. The at least one adhesive applied portion is provided to the at least one first protrusion. The at least one hole is disposed closer to the at least one interior cavity than the at least one adhesive applied portion.

With the cover according to the seventh aspect, the at least one hole reliably allows air to flow between the at least one interior cavity and the outside of the cover body when the cover body is mounted to the target portion in a state where adhesive is applied to the at least one adhesive applied portion. Thus, the at least one hole can reliably reduce or prevent the impact of the inner pressure on the state of the adhesive.

In accordance with an eighth aspect of the present invention, the cover according to the sixth or seventh aspect is configured so that the at least one first protrusion extends in the first direction. The at least one hole is at least partly provided to the at least one first protrusion.

With the cover according to the eighth aspect, the at least one hole reliably allows air to flow between the at least one interior cavity and the outside of the cover body when the cover body is mounted to the target portion in a state where adhesive is applied to the at least one adhesive applied portion. Thus, the at least one hole can reliably reduce or prevent the impact of the inner pressure on the state of the adhesive.

In accordance with a ninth aspect of the present invention, the cover according to the seventh or eighth aspect is configured so that the at least one hole is provided to the distal section of the at least one additional wall and extends in a third direction defined from the distal section of the at least one additional wall towards the proximal section of the at least one additional wall.

With the cover according to the ninth aspect, it is possible to efficiently arrange the at least one hole in the distal section.

In accordance with a tenth aspect of the present invention, the cover according to the ninth aspect is configured so that the at least one hole is partly provided to the at least one first protrusion.

With the cover according to the tenth aspect, the at least one hole reliably allows air to flow between the at least one interior cavity and the outside of the cover body when the cover body is mounted to the target portion in a state where adhesive is applied to the at least one adhesive applied portion. Thus, the at least one hole can reliably reduce or prevent the impact of the inner pressure on the state of the adhesive.

In accordance with an eleventh aspect of the present invention, the cover according to any one of the fifth to tenth aspects is configured so that the distal section of the at least one additional wall has at least one second protrusion extending in a fourth direction defined from the proximal section of the at least one additional wall towards the distal section of the at least one additional wall.

With the cover according to the eleventh aspect, the at least one second protrusion can make a space in which adhesive is provided between the target portion and the distal section.

In accordance with a twelfth aspect of the present invention, the cover according to the eleventh aspect is configured so that one of the at least one second protrusion is adjacent to the at least one hole.

With the cover according to the twelfth aspect, the one of the at least one second protrusion can make a space which is close to the at least one hole.

In accordance with a thirteenth aspect of the present invention, the cover according to the twelfth aspect is configured so that the one of the at least one second protrusion at least partly surrounds the at least one hole.

With the cover according to the thirteenth aspect, the one of the at least one second protrusion can reliably make the space which is close to the at least one hole.

In accordance with a fourteenth aspect of the present invention, the cover according to any one of the eleventh to thirteenth aspects is configured so that the at least one second protrusion includes a plurality of second protrusions.

With the cover according to the fourteenth aspect, the plurality of second protrusions can make the space in which adhesive is provided between the target portion and the distal section.

In accordance with a fifteenth aspect of the present invention, the cover according to any one of the fifth to fourteenth aspects is configured so that the distal section of the at least one additional wall has a most distal end. The at least one adhesive applied portion is disposed closer to the proximal section of the at least one additional wall than the most distal end.

With the cover according to the fifteenth aspect, it is possible to ensure a region of the at least one adhesive applied portion.

In accordance with a sixteenth aspect of the present invention, the cover according to any one of the first to fifteenth aspects is configured so that the cover body is configured to cover a component disposed to at least one of the cover and the target portion of one of the human-powered vehicle and the fishing tackle.

With the cover according to the sixteenth aspect, the cover body can protect the component.

In accordance with a seventeenth aspect of the present invention, the cover according to the sixteenth aspect is configured so that the component includes an electrical component. The cover body is configured to cover the electrical component disposed to at least one of the cover and the target portion of one of the human-powered vehicle and the fishing tackle.

With the cover according to the seventeenth aspect, the cover body can protect the electrical component.

In accordance with an eighteenth aspect of the present invention, the cover according to any one of the first to seventeenth aspects is configured so that the cover body is configured to be mounted to a crank arm of the human-powered vehicle.

With the cover according to the eighteenth aspect, the cover body can protect a part of the crank arm.

In accordance with a nineteenth aspect of the present invention, the cover according to any one of the first to eighteenth aspects further comprises at least one closing member configured to close the at least one hole.

With the cover according to the nineteenth aspect, the at least one closing member can keep the at least one interior cavity airtight.

In accordance with a twentieth aspect of the present invention, the cover according to the nineteenth aspect is configured so that the at least one closing member includes at least one of at least one filler and at least one attachment member. The at least one filler is disposed in the at least one hole to close the at least one hole. The at least one attachment member is attached to an outer surface of the cover body to cover the at least one hole.

With the cover according to the twentieth aspect, it is possible to reliably close the at least one hole.

In accordance with a twenty-first aspect of the present invention, the cover according to any one of the first to twentieth aspects is configured so that the at least one hole is disposed closer to the at least one interior cavity than the at least one adhesive applied portion.

With the cover according to the twenty-first aspect, it is possible to reliably close the at least one hole.

In accordance with a twenty-second aspect of the present invention, a device of a human-powered vehicle comprises a target portion and the cover according to any one of the first to twenty-first aspects.

With the device according to the twenty-second aspect, it is possible to mount the cover to the target portion of the human-powered vehicle.

In accordance with a twenty-third aspect of the present invention, a device of a fishing tackle comprises a target portion and the cover according to any one of the first to twenty-first aspects.

With the device according to the twenty-third aspect, it is possible to mount the cover to the target portion of the fishing tackle.

In accordance with a twenty-fourth aspect of the present invention, a method for mounting a cover to a target portion of one of a human-powered vehicle and a fishing tackle comprises: providing a cover body of the cover, the cover body including at least one adhesive applied portion and at least one hole, the cover body being configured to define at least one interior cavity; applying adhesive to the at least one adhesive applied portion of the cover body; attaching the cover body to the target portion so as to allow air to flow between the at least one interior cavity and an outside of the cover body via the at least one hole; and closing the at least one hole with at least one closing member.

With the method according to the twenty-fourth aspect, the at least one hole allows air to flow between the at least one interior cavity and an outside of the cover body when the cover body is mounted to the target portion in a state where adhesive is applied to the at least one adhesive applied portion. Thus, it is possible to reduce or prevent an increase in inner pressure of the at least one interior cavity when the cover body is mounted to the target portion. Accordingly, the at least one hole can reduce or prevent the impact of the inner pressure on the state of the adhesive.

In accordance with a twenty-fifth aspect of the present invention, the method according to the twenty-fourth aspect is configured so that the closing of the at least one hole includes at least one of: disposing at least one filler in the at least one hole to close the at least one hole; and attaching at least one attachment member to an outer surface of the cover body to cover the at least one hole.

With the method according to the twenty-fifth aspect, it is possible to reliably close the at least one hole.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
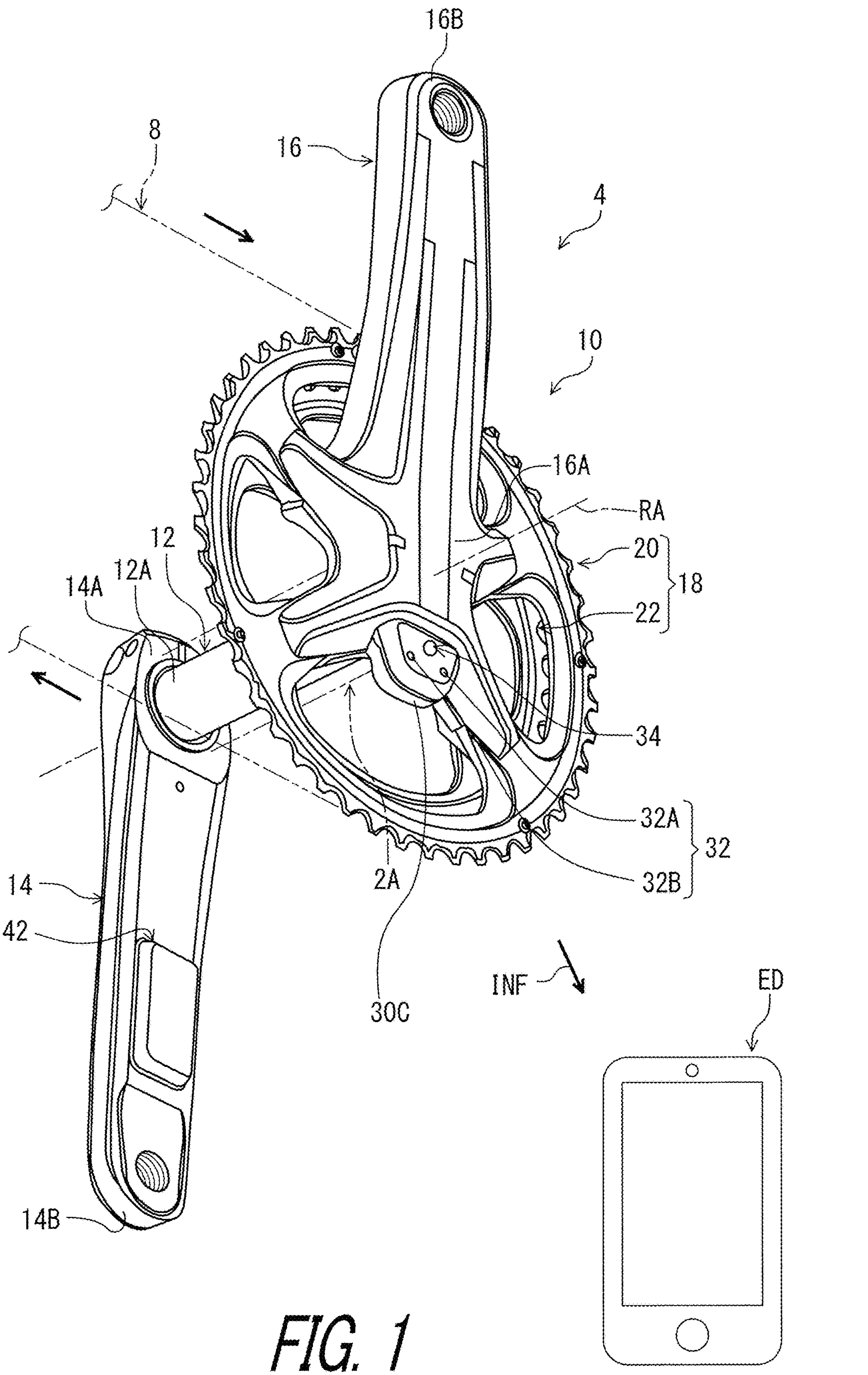
FIG. 1 is a perspective view of a device of a human-powered vehicle in accordance with one of embodiments.

The embodiments will now be described with reference to the accompanying drawings, wherein like reference numerals designate corresponding or identical elements throughout the various drawings.

Figure 15:
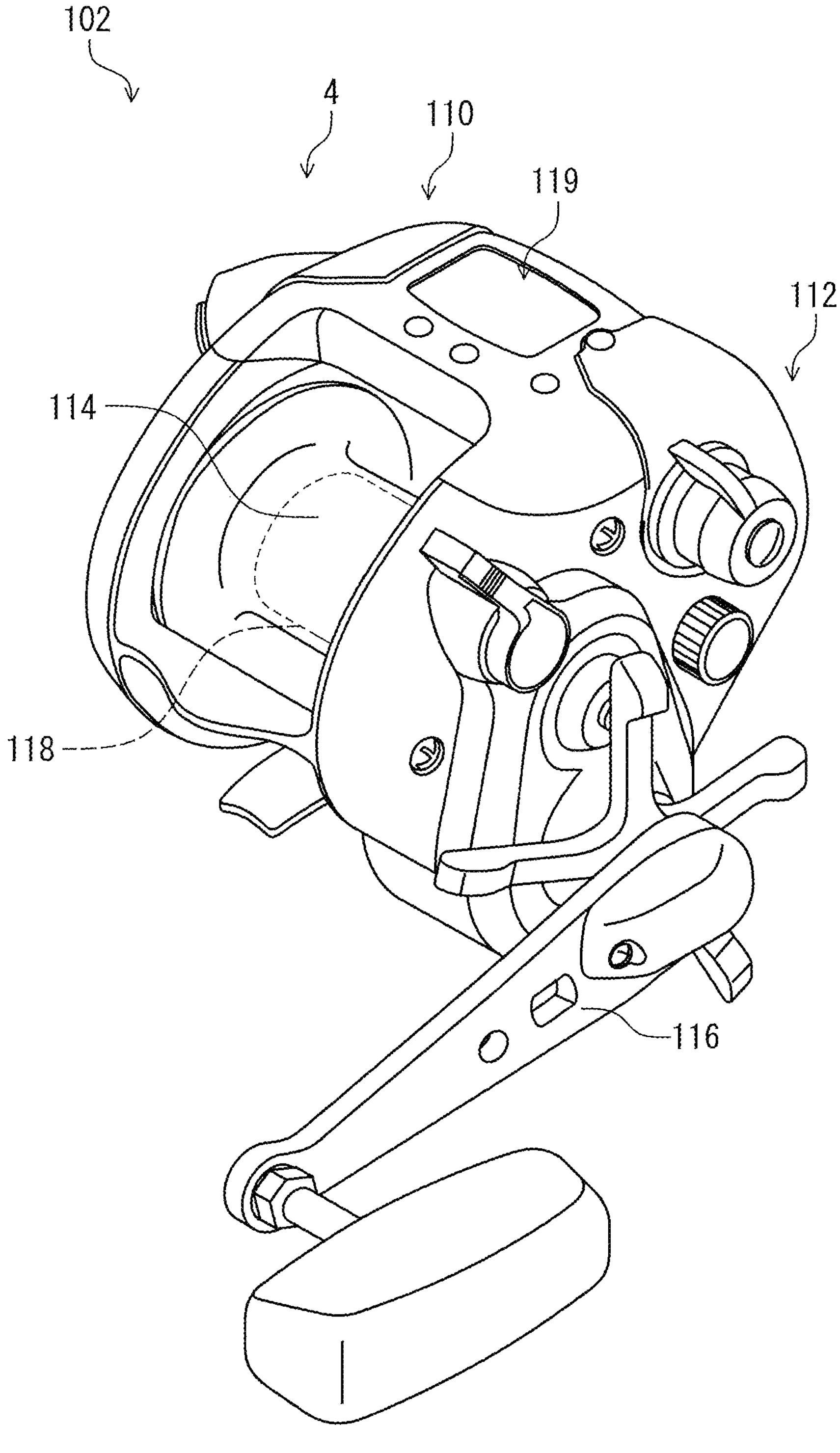
FIG. 15 is a perspective view of a device of a fishing tackle in accordance with one of embodiments.

As seen in FIGS. 1 and 15, one of a human-powered vehicle 2 and a fishing tackle 102 includes a device 4 in accordance with one of embodiments. In the present application, the term "human-powered vehicle" includes a vehicle to travel with a motive power including at least a human power of a user who rides the vehicle. The human-powered vehicle includes a various kind of bicycles such as a mountain bike, a road bike, a city bike, a cargo bike, a hand bike, and a recumbent bike. Furthermore, the human-powered vehicle includes an electric bike called as an E-bike. The electric bike includes an electrically assisted bicycle configured to assist propulsion of a vehicle with an electric motor. However, a total number of wheels of the human-powered vehicle is not limited to two. For example, the human-powered vehicle includes a vehicle having one wheel or three or more wheels. Especially, the human-powered vehicle does not include a vehicle that uses only a driving source as motive power. Examples of the driving source include an internal-combustion engine and an electric motor. Generally, a light road vehicle, which includes a vehicle that does not require a driver's license for a public road, is assumed as the human-powered vehicle.

As seen in FIG. 1, the device 4 includes a crank assembly 10 in a case where the human-powered vehicle 2 includes the device 4. The crank assembly 10 is rotatably coupled to a vehicle body 2A of the human-powered vehicle 2 about a rotational center axis RA. The device 4 can include another device of the human-powered vehicle 2.

As seen in FIG. 15, the device 4 includes a fishing reel 110 in a case where the fishing tackle 102 includes the device 4. The fishing reel 110 will be described in detail later. The device 4 can include another device of the fishing tackle 102. The fishing tackle 102 will be described in detail later.

Figure 2:
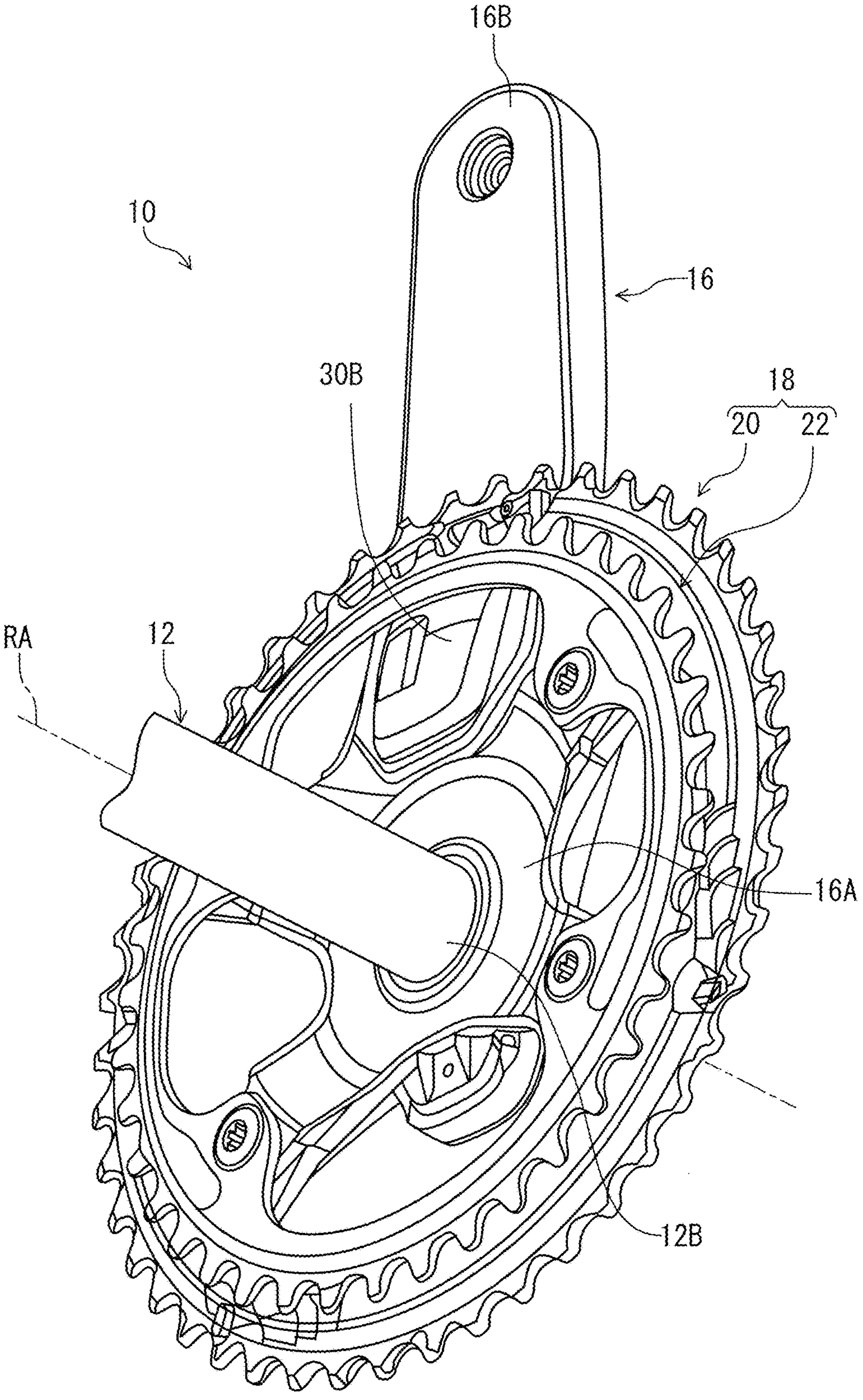
FIG. 2 is another perspective view of the device of the human-powered vehicle illustrated in FIG. 1.

As seen in FIGS. 1 and 2, the crank assembly 10 comprises a crank axle 12. The crank axle 12 is configured to be rotatably coupled to the vehicle body 2A of the human-powered vehicle 2 about the rotational center axis RA. The crank axle 12 extends along the rotational center axis RA. The crank axle 12 includes a first axle end 12A and a second axle end 12B. The crank axle 12 extends between the first axle end 12A and the second axle end 12B along the rotational center axis RA.

The crank assembly 10 comprises a crank arm 14. The crank arm 14 is coupled to the crank axle 12. The crank arm 14 extends radially outwardly from the crank axle 12 with respect to the rotational center axis RA. The crank arm 14 includes a proximal end 14A and a distal end 14B. The crank arm 14 extends between the proximal end 14A and the distal end 14B. The proximal end 14A is coupled to the first axle end 12A. A pedal is coupled to the distal end 14B.

The crank assembly 10 comprises a crank arm 16. The crank arm 16 is coupled to the crank axle 12. The crank arm 16 extends radially outwardly from the crank axle 12 with respect to the rotational center axis RA. The crank arm 16 includes a proximal end 16A and a distal end 16B. The crank arm 16 extends between the proximal end 16A and the distal end 16B. The proximal end 16A is coupled to the second axle end 12B. A pedal is coupled to the distal end 16B.

The crank assembly 10 comprises at least one front sprocket 18. The at least one front sprocket 18 is coupled to at least one of the crank axle 12 and the crank arm 14. The at least one front sprocket 18 is configured to be engaged with a chain 8. In the present embodiment, the at least one front sprocket 18 is coupled to the crank axle 12 and the crank arm 14. The at least one front sprocket 18 includes front sprockets 20 and 22. One of the front sprockets 20 and 22 can be omitted from the crank assembly 10 if needed or desired. The at least one front sprocket 18 can include at least one additional front sprocket in addition to the front sprockets 20 and 22 if needed or desired. Alternatively, the at least one front sprocket 18 can include only one front sprocket, i.e. a solitary front sprocket if needed or desired.

Figure 3:
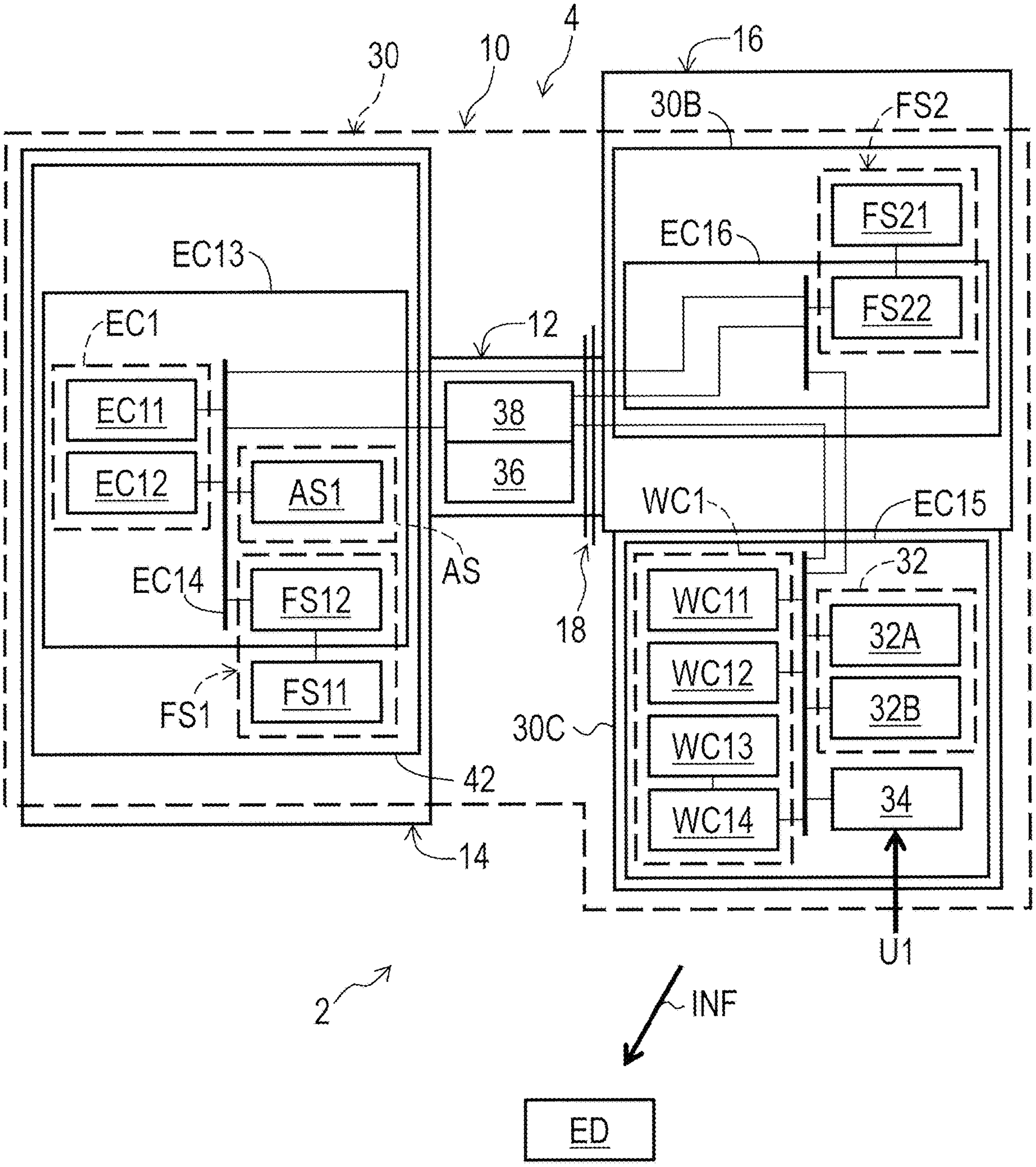
FIG. 3 is a schematic block diagram of the device of the human-powered vehicle illustrated in FIG. 1.

As seen in FIG. 3, the crank assembly 10 comprises a control device 30. The control device 30 is configured to be provided to at least one of the crank axle 12, the crank arm 14 and/or 16, and the at least one front sprocket 18. In the present embodiment, the control device 30 is configured to be provided to the crank arms 14 and 16. However, the control device 30 can be configured to be provided to a portion other than the crank arms 14 and 16 if needed or desired. The control device 30 can be configured to be provided to only one of the crank arms 14 and 16 if needed or desired. Examples of the device 4 include the crank assembly 10, an operating device, a front wheel, a rear wheel, a pedal, a rear sprocket, a front suspension, a rear suspension, a front hub assembly, and a rear hub assembly. The control device 30 can be configured to be provided to one of the operating device, the front wheel, the rear wheel, the pedal, the rear sprocket, the front suspension, the rear suspension, the front hub assembly, and the rear hub assembly if needed or desired.

In the present application, the following directional terms "front," "rear," "forward," "rearward," "left," "right," "transverse," "upward" and "downward" as well as any other similar directional terms refer to those directions which are determined based on the user who is in the user's standard position in the human-powered vehicle 2 while the user faces toward a handlebar or steering. Examples of the user's standard position include a saddle and a seat. Accordingly, these terms, as utilized to describe the device 4, the crank assembly 10, the control device 30, or other components, should be interpreted relative to the human-powered vehicle 2 equipped with the device 4, the crank assembly 10, the control device 30, or other components as used in an upright riding position on a horizontal surface.

As seen in FIG. 3, the control device 30 for the human-powered vehicle 2 comprises an electronic controller EC1. The control device 30 further comprises a wireless communicator WC1. The electronic controller EC1 is electrically connected to the wireless communicator WC1. The wireless communicator WC1 is configured to wirelessly communicate with another wireless communicator. The electronic controller EC1 is electrically connected to the wireless communicator WC1 to control the wireless communicator WC1. The electronic controller EC1 can be referred to as electronic controller circuitry EC1. The wireless communicator WC1 can be referred to as wireless communicator circuitry WC1. The electronic controller EC1 can be referred to as an electrical component EC1.

For example, the electronic controller EC1 is provided to the crank arm 14. The wireless communicator WC1 is provided to the crank arm 16. Alternatively, the electronic controller EC1 can be provided to one of the crank axle 12, the crank arm 16, and the at least one front sprocket 18. The wireless communicator WC1 can be provided to one of the crank axle 12, the crank arm 14, and the at least one front sprocket 18.

The electronic controller EC1 includes a processor EC11 and a memory EC12. The control device 30 includes a circuit board EC13 and a system bus EC14. The electronic controller EC1 is electrically mounted on the circuit board EC13. The processor EC11 and the memory EC12 are electrically mounted on the circuit board EC13. The processor EC11 is coupled to the memory EC12. The memory EC12 is coupled to the processor EC11. The processor EC11 is electrically connected to the memory EC12 via the circuit board EC13 and the system bus EC14. The memory EC12 is electrically connected to the processor EC11 via the circuit board EC13 and the system bus EC14. For example, the electronic controller EC1 includes a semiconductor. The processor EC11 includes a semiconductor. The memory EC12 includes a semiconductor. The circuit board EC13 can also be referred to as an electrical component EC13.

For example, the processor EC11 includes at least one of a central processing unit (CPU), a micro processing unit (MPU), a graphics processing unit (GPU), and a memory controller. The memory EC12 is electrically connected to the processor EC11. For example, the memory EC12 includes at least one of a volatile memory and a non-volatile memory. Examples of the volatile memory include a random-access memory (RAM) and a dynamic random-access memory (DRAM). Examples of the non-volatile memory include a read only memory (ROM), an electrically erasable programmable ROM (EEPROM), and a magnetic disc. The memory EC12 includes storage areas each having an address. The processor EC11 is configured to control the memory EC12 to store data in the storage areas of the memory EC12 and read data from the storage areas of the memory EC12. The processor EC11 can also be referred to as a hardware processor EC11 or a processor circuit or circuitry EC11. The memory EC12 can also be referred to as a hardware memory EC12 or a memory circuit or circuitry EC12. The memory EC12 can also be referred to as a non-transitory computer-readable storage medium EC12. Namely, the electronic controller EC1 includes the non-transitory computer-readable storage medium EC12. The processor EC11 can also be referred to as an electrical component EC11. The memory EC12 can also be referred to as an electrical component EC12.

The electronic controller EC1 is configured to execute at least one control algorithm of the control device 30. For example, the electronic controller EC1 is programmed to execute at least one control algorithm of the control device 30. The memory EC12 stores at least one program including at least one program instruction. The at least one program is read into the processor EC11, and thereby the at least one control algorithm of the control device 30 is executed based on the at least one program.

The structure of the electronic controller EC1 is not limited to the above structure. The structure of the electronic controller EC1 is not limited to the processor EC11 and the memory EC12. The electronic controller EC1 can be realized by hardware alone or a combination of hardware and software. In the present embodiment, the processor EC11 and the memory EC12 are integrated as a single chip such as an application specific integrated circuit (ASIC) or a field programmable gate array (FPGA). However, the processor EC11 and the memory EC12 can be separate chips if needed or desired.

The electronic controller EC1 can include at least two electronic controller circuits which are separately provided. The at least one control algorithm of the control device 30 can be executed by the at least two electronic controller circuits if needed or desired. The electronic controller EC1 can include at least two processors which are separately provided. The electronic controller EC1 can include at least two memories which are separately provided. The at least one control algorithm of the control device 30 can be executed by the at least two processors if needed or desired. The at least one control algorithm of the control device 30 can be stored in the at least two memories if needed or desired. The electronic controller EC1 can include at least two circuit boards which are separately provided if needed or desired. The electronic controller EC1 can include at least two system buses which are separately provided if needed or desired.

For example, the wireless communicator WC1 includes a signal transmitting circuit WC11, a signal receiving circuit WC12, and an antenna WC13. The signal transmitting circuit WC11 is electrically connected to the antenna WC13. The signal receiving circuit WC12 is electrically connected to the antenna WC13. The wireless communicator WC1 can also be referred to as wireless communicator circuitry WC1.

The wireless communicator WC1 is configured to transmit wireless signals via the antenna WC13. The wireless communicator WC1 is configured to superimpose digital signals on carrier wave using a predetermined wireless communication protocol to wirelessly transmit signals. In the present embodiment, the wireless communicator WC1 is configured to encrypt signals using a cryptographic key to generate encrypted wireless signals.

The wireless communicator WC1 is configured to receive wireless signals via the antenna WC13. In the present embodiment, the wireless communicator WC1 is configured to decode the wireless signals to recognize signals transmitted from other wireless communicators. The wireless communicator WC1 is configured to decrypt the wireless signals using the cryptographic key.

The wireless communicator WC1 includes a signal amplifier WC14. The signal amplifier WC14 is coupled to the signal transmitting circuit WC11, the signal receiving circuit WC12, and the antenna WC13. The signal amplifier WC14 is configured to selectively amplify the signals of the antenna WC13. The signal amplifier WC14 can be controlled by the electronic controller EC1. The electronic controller EC1 can be configured to control the signal amplifier WC14 such that the signal amplifier WC14 operates in a low-power or high-power consumption state.

The control device 30 can include a wired communicator and a cable connector. The wired communicator can be electrically connected to the electronic controller EC1. The cable connector can be electrically connected to the wired communicator. The wired communicator can be configured to communicate with another wired communicator via the cable connector and an electric cable connected to the cable connector.

The wired communicator can be configured to communicate with another wired communicator using power line communication (PLC) technology. For example, the electric cable includes a ground line and a voltage line that are detachably connected to a serial bus that is formed by communication interfaces. The wired communicator can be configured to communicate with another wired communicator through the voltage line using the PLC technology. Since the PLC technology has been known, it will not be described in detail here for the sake of brevity.

As seen in FIG. 3, the control device 30 further comprises a notification unit 32. The notification unit 32 is configured to notify the user of vehicle information relating to the human-powered vehicle 2. The notification unit 32 is configured to notify the user of component information relating to the device 4 of the human-powered vehicle 2.

The notification unit 32 includes a first indicator 32A. The first indicator 32A is configured to indicate component information relating to the device 4. The first indicator 32A is configured to indicate crank information relating to the crank assembly 10. The first indicator 32A is configured to indicate crank information relating to the crank arm 14. For example, the first indicator 32A includes a light emitter configured to emit light based on the vehicle information or component information. The notification unit 32 includes a light emitter configured to emit light based on the device 4 information. Examples of the light emitter include a light emitting diode (LED). The notification unit 32 is configured to notify the user of the vehicle information using lights having different colors. The notification unit 32 can include an element other than the light emitter if needed or desired. For example, the notification unit 32 can include a loudspeaker or a display if needed or desired.

The notification unit 32 includes a second indicator 32B. The second indicator 32B is configured to indicate component information relating to the device 4. The second indicator 32B is configured to indicate crank information relating to the crank assembly 10. The second indicator 32B is configured to indicate crank information relating to the crank arm 16. For example, the second indicator 32B includes a light emitter configured to emit light based on the vehicle information or component information. The notification unit 32 includes a light emitter configured to emit light based on the device 4 information. Examples of the light emitter include a light emitting diode (LED). The notification unit 32 is configured to notify the user of the vehicle information using lights having different colors. The notification unit 32 can include an element other than the light emitter if needed or desired. For example, the notification unit 32 can include a loudspeaker or a display if needed or desired. One of the first indicator 32A and the second indicator 32B can be omitted from the notification unit 32.

The control device 30 includes a user interface 34. The user interface 34 is configured to receive a user input U1. The user input U1 includes at least one of a power-on, a power-off, a start of a pairing mode, and an end of the pairing mode. The electronic controller EC1 is electrically connected to the user interface 34 to receive the user input U1. For example, the user interface 34 includes a switch. The user interface 34 can include another part other than the switch if needed or desired. For example, the user interface 34 can include a touch panel which serves both as a display and as an input device.

The control device 30 includes an additional circuit board EC15. The additional circuit board EC15 is separately provided from the circuit board EC13. The notification unit 32 and the user interface 34 are electrically mounted on the additional circuit board EC15. The first indicator 32A and the second indicator 32B are electrically mounted on the additional circuit board EC15. The additional circuit board EC15 is electrically connected to the circuit board EC13.

The control device 30 includes an electric power source 36 and a power source holder 38. The power source holder 38 is configured to detachably and reattachably hold the electric power source 36. The power source holder 38 is configured to be electrically connected to the electronic controller EC1, the wireless communicator WC1, the notification unit 32, and other electronic parts of the control device 30. The electric power source 36 is configured to supply electricity to the electronic controller EC1, the wireless communicator WC1, the notification unit 32, and other electronic parts of the control device 30 via the power source holder 38. Examples of the electric power source 36 include a primary battery and a secondary battery. The control device 30 can be configured to receive electricity from another electric power source other than the electric power source 36 via an electric cable if needed or desired.

In the present embodiment, the electric power source 36 and the power source holder 38 are provided in the crank axle 12. However, the electric power source 36 and the power source holder 38 can be provided to another portion of the device 4 other than the crank axle 12.

As seen in FIG. 3, the control device 30 for the human-powered vehicle 2 comprises a sensor FS1. The sensor FS1 is configured to obtain first information indicative of deformation of the device 4 of the human-powered vehicle 2. The sensor FS1 is configured to obtain the first information indicative of deformation of the crank assembly 10. The sensor FS1 is configured to obtain the first information indicative of deformation of the crank arm 14. The sensor FS1 can also be referred to as an electrical component FS1.

The sensor FS1 includes at least one strain gauge FS11 and at least one sensor circuit FS12. The at least one strain gauge FS11 is configured to detect the deformation of the device 4. The at least one strain gauge FS11 can include a plurality of strain gauges FS11. The at least one strain gauge FS11 is attached to the device 4. The at least one strain gauge FS11 is configured to detect the deformation of the crank assembly 10. The at least one strain gauge FS11 is attached to the crank assembly 10. The at least one strain gauge FS11 is configured to detect the deformation of the crank arm 14. The at least one strain gauge FS11 is attached to the crank arm 14. The at least one sensor circuit FS12 is operatively connected to the at least one strain gauge FS11 and is configured to generate the first information based on an output of the at least one strain gauge FS11. The at least one strain gauge FS11 and the at least one sensor circuit FS12 constitute at least one bridge circuit. The electronic controller EC1 is electrically connected to the sensor FS1 to receive the first information from the sensor FS1. The at least one sensor circuit FS12 is electrically mounted on the circuit board EC13 while the at least one strain gauge FS11 is attached to the crank arm 14.

As seen in FIG. 3, the control device 30 for the human-powered vehicle 2 comprises a sensor FS2. The sensor FS2 is configured to obtain second information indicative of deformation of the device 4 of the human-powered vehicle 2. The sensor FS2 is configured to obtain the second information indicative of deformation of the crank assembly 10. The sensor FS2 is configured to obtain the second information indicative of deformation of the crank arm 16.

The sensor FS2 includes at least one strain gauge FS21 and at least one sensor circuit FS22. The at least one strain gauge FS21 is configured to detect the deformation of the device 4. The at least one strain gauge FS21 is attached to the device 4. The at least one strain gauge FS21 is configured to detect the deformation of the crank assembly 10. The at least one strain gauge FS21 is attached to the crank assembly 10. The at least one strain gauge FS21 is configured to detect the deformation of the crank arm 16. The at least one strain gauge FS21 is attached to the crank arm 16. The at least one sensor circuit FS22 is operatively connected to the at least one strain gauge FS21 and is configured to generate the second information based on an output of the at least one strain gauge FS21. The at least one strain gauge FS21 and the at least one sensor circuit FS22 constitute at least one bridge circuit. The electronic controller EC1 is electrically connected to the sensor FS2 to receive the second information from the sensor FS2. The control device 30 includes an additional circuit board EC16. The at least one sensor circuit FS22 is electrically mounted on the additional circuit board EC16 while the at least one strain gauge FS21 is attached to the crank arm 16. The additional circuit board EC16 is electrically connected to the circuit board EC13 and the additional circuit board EC15. The additional circuit board EC15 is electrically connected to the circuit board EC13 via the additional circuit board EC16. Alternatively, the additional circuit board EC15 can be electrically connected to the circuit board EC13 directly.

In the present embodiment, the wireless communicator WC1 is electrically mounted on the additional circuit board EC15. The wireless communicator WC1 is electrically connected to the electronic controller EC1 via the additional circuit board EC15, the additional circuit board EC16, and the circuit board EC13. However, the wireless communicator WC1 can be electrically mounted on one of the circuit board EC13 and the additional circuit board EC15 if needed or desired. A wireless communicator can also be electrically mounted on each of the circuit board EC13 and the additional circuit board EC15 instead of the wireless communicator WC1 if needed or desired.

As seen in FIG. 3, the control device 30 further comprises an acceleration sensor AS. The acceleration sensor AS is configured to sense acceleration applied to the device 4. The acceleration sensor AS is provided to one of the crank axle 12, the crank arm 14, the crank arm 16, and the at least one front sprocket 18. For example, the acceleration sensor AS is provided to the crank arm 14. The acceleration sensor AS is configured to sense acceleration applied to the crank arm 14. However, the acceleration sensor AS can be provided to another part of the crank assembly 10 if needed or desired. The acceleration sensor AS can also be referred to as an electrical component AS. For example, the acceleration sensor AS includes a 3-axis accelerometer AS1 having three axes. The electronic controller EC1 is electrically connected to the acceleration sensor AS to receive the acceleration from the acceleration sensor AS.

The electronic controller EC1 is configured to calculate a rotational position of the device 4 about the rotational center axis RA based on the acceleration sensed by the acceleration sensor AS. The electronic controller EC1 is configured to calculate a rotational position of the device 4 about the rotational center axis RA based on the first acceleration, the second acceleration, and the third acceleration.

The electronic controller EC1 is configured to calculate at least one of a cadence of the crank assembly 10 and an angular velocity of the crank assembly 10 based on the acceleration. The electronic controller EC1 is configured to calculate at least one of the cadence and the angular velocity based on the first acceleration, the second acceleration, and the third acceleration. For example, the electronic controller EC1 is configured to calculate at least one of the cadence and the angular velocity based on the change in the rotational position.

The control device 30 is configured to transmit component information INF relating to the device 4 to another device such as an electric device ED. The electronic controller EC1 is configured to control the wireless communicator WC1 to wirelessly transmit the component information INF to the electric device ED. Examples of the electric device ED include a smartphone, a tablet computer, a cycle computer, and a personal computer.

Figure 4:
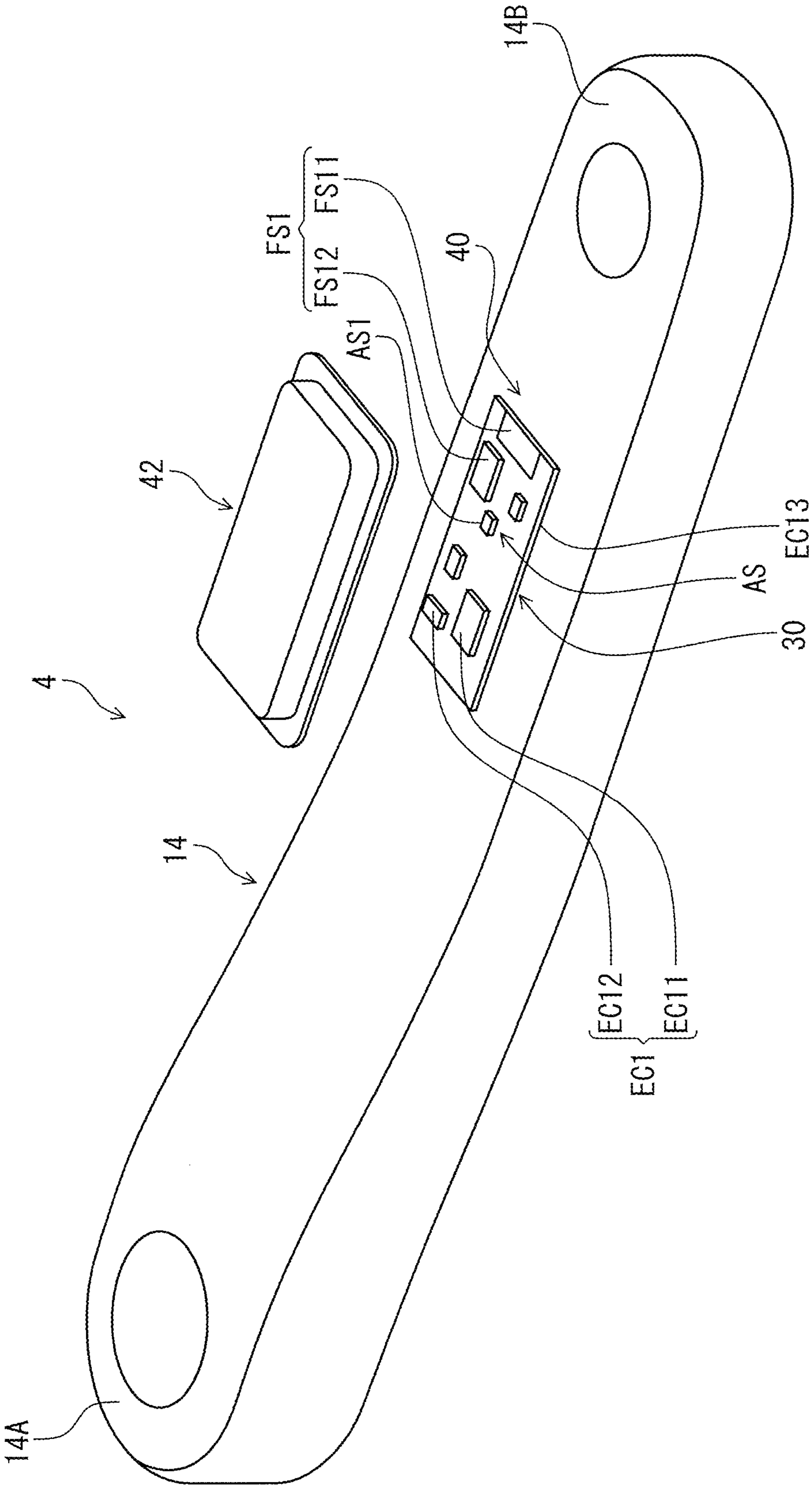
FIG. 4 is an exploded perspective view of the device of the human-powered vehicle illustrated in FIG. 1.

As seen in FIG. 4, the device 4 of the human-powered vehicle 2 comprises a target portion 40 and a cover 42. The cover 42 is configured to be mounted to the target portion 40. The cover 42 is configured to be attached to the target portion 40.

In the present embodiment, the device 4 includes the crank arm 14. The crank arm 14 includes the target portion 40. The cover 42 is configured to be mounted to the crank arm 14. The cover 42 is configured to be attached to the crank arm 14. However, another part such as the crank axle 12, the crank arm 16, and the at least one front sprocket 18 can include the target portion 40 if needed or desired. The device 4 is not limited to the crank assembly 10.

The control device 30 is at least partly mounted to the crank arm 14. The circuit board EC13 is mounted to the crank arm 14. The circuit board EC13 is mounted to the target portion 40. The circuit board EC13 is attached to the crank arm 14. The circuit board EC13 is attached to the target portion 40.

Figure 5:
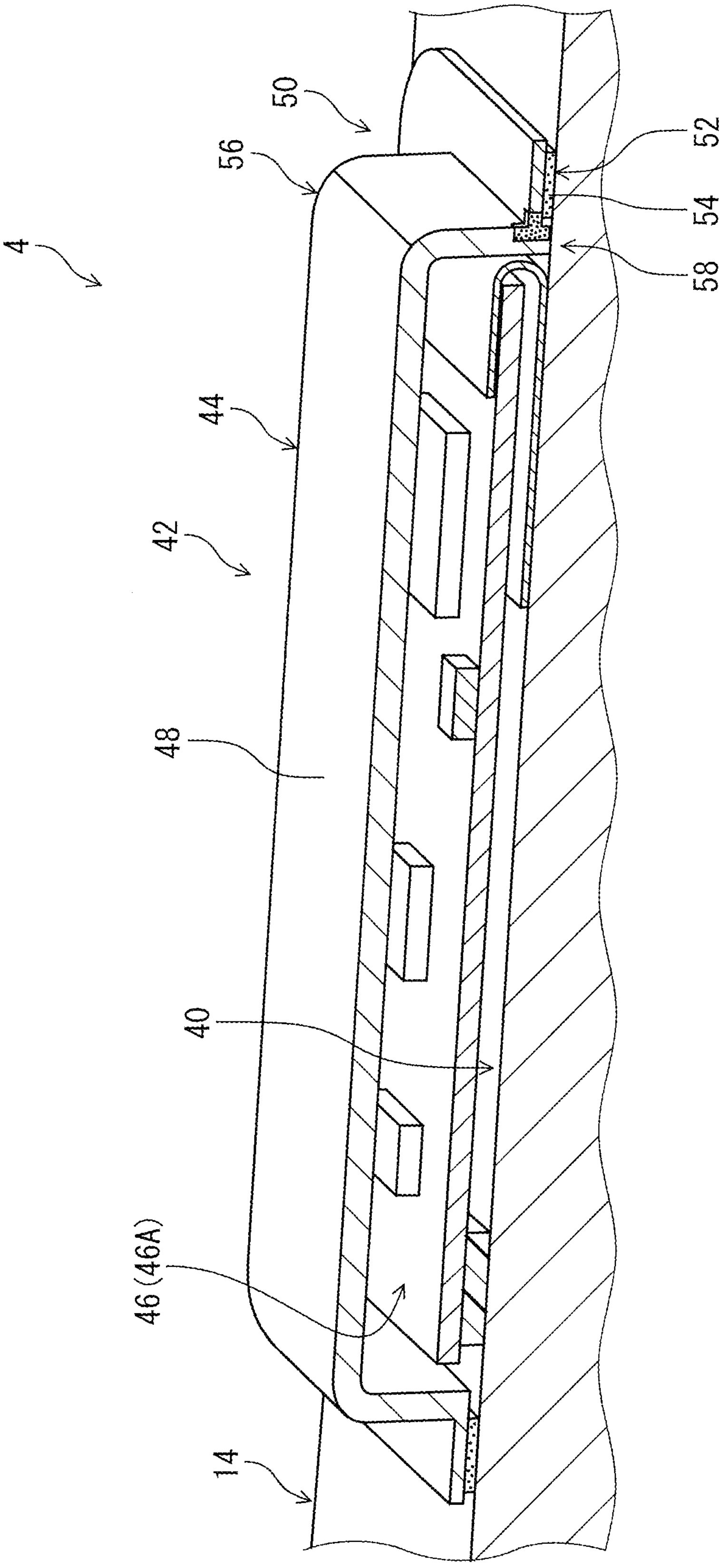
FIG. 5 is a perspective cross-sectional view of the device of the human-powered vehicle taken along line V-V of FIG. 10.

As seen in FIG. 5, the cover 42 comprises a cover body 44. The cover body 44 is configured to be mounted to the target portion 40 of one of the human-powered vehicle 2 and the fishing tackle 102 (see e.g., FIG. 17). The cover body 44 is configured to be attached to the target portion 40. In the present embodiment, the cover body 44 is configured to be mounted to the crank arm 14 of the human-powered vehicle 2.

The cover body 44 is configured to define at least one interior cavity 46. The cover body 44 is configured to define the at least one interior cavity 46 between the target portion 40 and the cover body 44 in a mounting state where the cover 42 is mounted to the target portion 40. The circuit board EC13 is at least partly provided in the at least one interior cavity 46 in the mounting state where the cover 42 is mounted to the target portion 40.

In the present embodiment, the at least one interior cavity 46 includes an interior cavity 46A defined by the cover body 44. Alternatively, the at least one interior cavity 46 can include at least two interior cavities if needed or desired. The cover body 44 can be configured to define at least two interior cavities if needed or desired.

The cover body 44 includes a base wall 48 and at least one additional wall 50. The base wall 48 is spaced apart from the target portion 40. The at least one interior cavity 46 is provided between the base wall 48 and the target portion 40 in the mounting state. The at least one additional wall 50 extends from the base wall 48 so that the at least one interior cavity 46 is defined by the base wall 48 and the at least one additional wall 50. The at least one additional wall 50 is attached to the target portion 40. The cover body 44 includes at least one adhesive applied portion 52 to which adhesive 54 is to be applied. The at least one additional wall 50 includes the at least one adhesive applied portion 52.

The at least one additional wall 50 has a proximal section 56 and a distal section 58. Namely, the cover body 44 has the distal section 58. The distal section 58 is configured to be attached to the target portion 40 of one of the human-powered vehicle 2 and the fishing tackle 102 (see e.g., FIG. 17).

The proximal section 56 of the at least one additional wall 50 is connected to the base wall 48. The distal section 58 of the cover body 44 has the at least one adhesive applied portion 52. The distal section 58 of the at least one additional wall 50 has the at least one adhesive applied portion 52.

Figure 6:
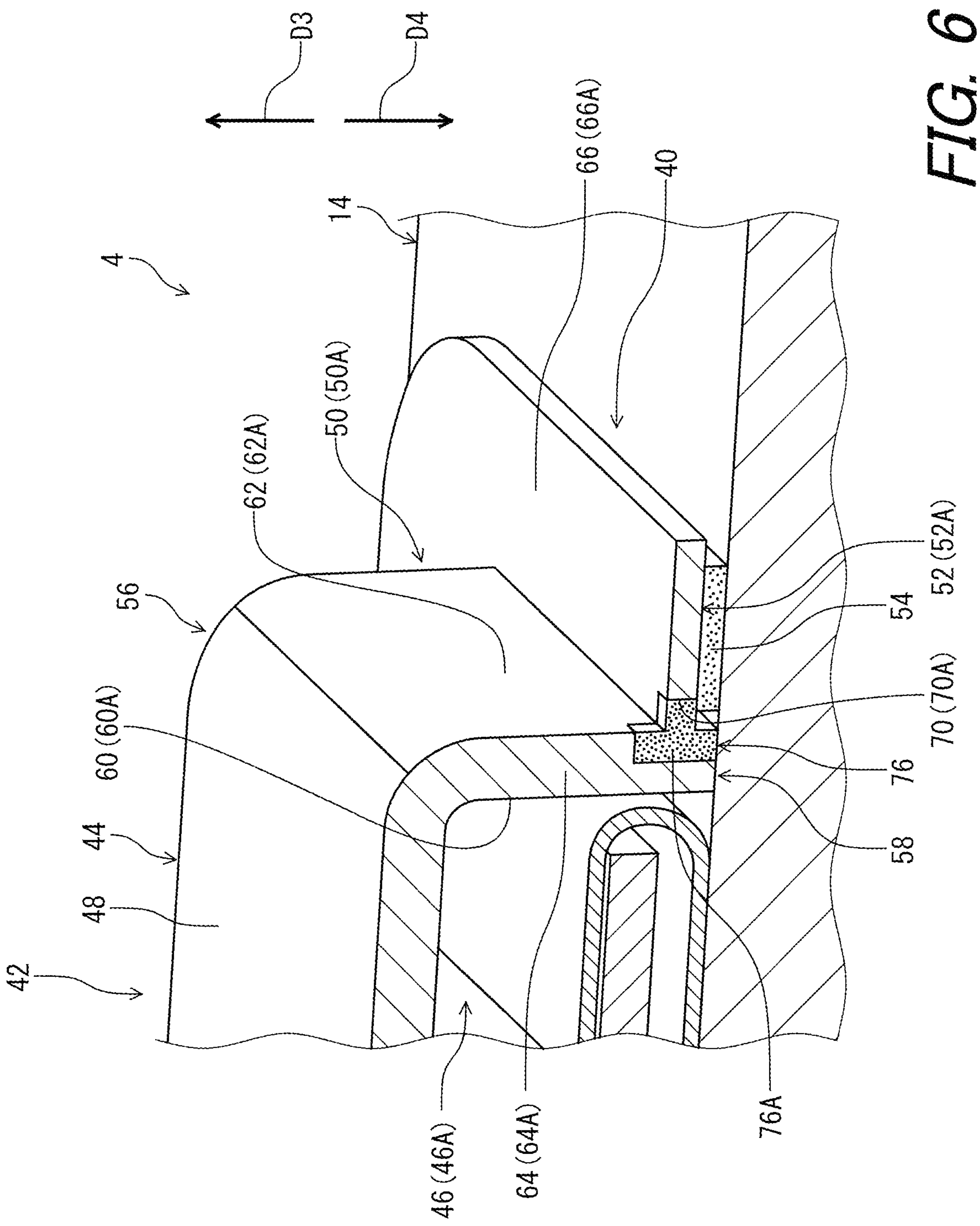
FIG. 6 is a partial perspective cross-sectional view of the device of the human-powered vehicle taken along line VI-VI of FIG. 10.

As seen in FIG. 6, the at least one additional wall 50 has an interior surface 60 and an exterior surface 62. The distal section 58 of the cover body 44 has the interior surface 60 and the exterior surface 62. The interior surface 60 faces toward the at least one interior cavity 46. The interior surface 60 faces toward the interior cavity 46A. The interior surface 60 at least partly defines the at least one interior cavity 46. The exterior surface 62 is provided on a reverse side of the interior surface 60.

Figure 7:
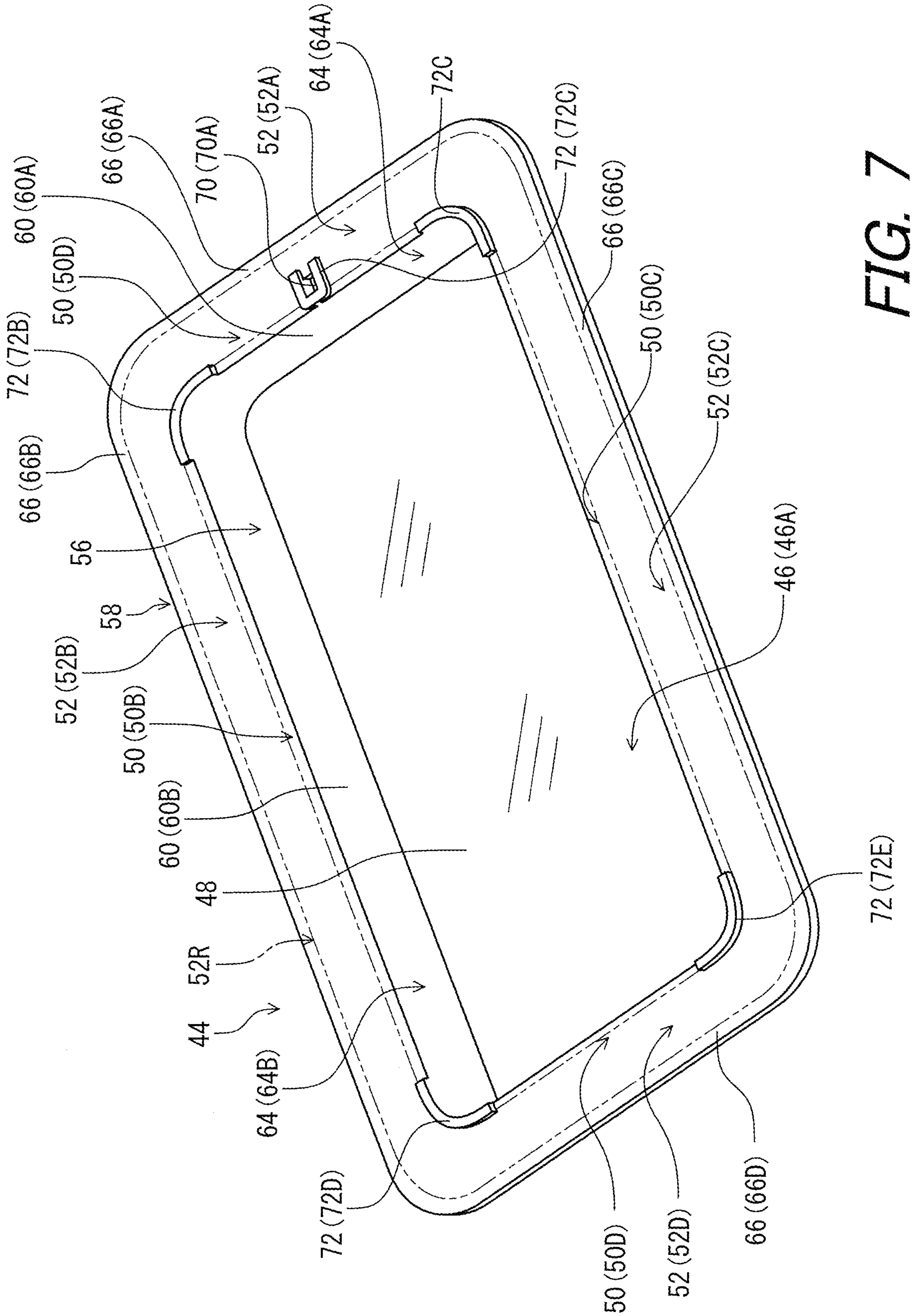
FIG. 7 is a perspective view of a cover body of a cover included in the device of the human-powered vehicle illustrated in FIG. 1.
Figure 8:
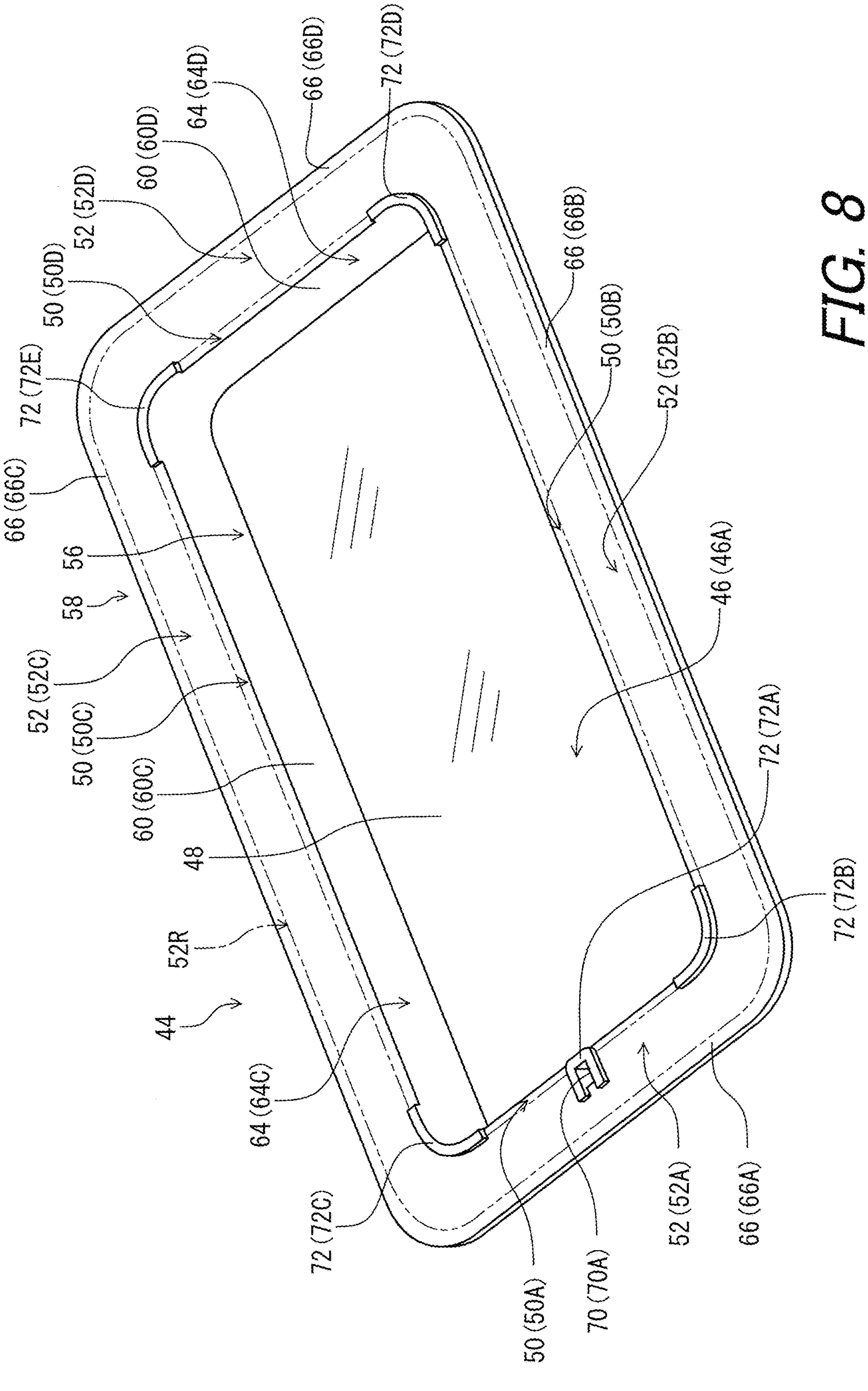
FIG. 8 is another perspective view of the cover body of the cover included in the device of the human-powered vehicle illustrated in FIG. 1.

As seen in FIGS. 7 and 8, in the present embodiment, the at least one additional wall 50 includes additional walls 50A, 50B, 50C, and 50D. The additional walls 50A, 50B, 50C, and 50D extend from the base wall 48 so that the interior cavity 46A is defined by the base wall 48 and the additional walls 50A, 50B, 50C, and 50D.

The additional walls 50A, 50B, 50C, and 50D are coupled to the base wall 48. The additional wall 50A is coupled to the additional walls 50B and 50C. The additional wall 50B is coupled to the additional walls 50A and 50D. The additional wall 50C is coupled to the additional walls 50A and 50D. The additional wall 50D is coupled to the additional walls 50B and 50C.

The additional walls 50A, 50B, 50C, and 50D have the proximal section 56 and the distal section 58. The proximal section 56 of the additional walls 50A, 50B, 50C, and 50D is connected to the base wall 48. The additional walls 50A, 50B, 50C, and 50D have the interior surface 60 and the exterior surface 62.

In the present embodiment, the at least one adhesive applied portion 52 includes adhesive applied portions 52A, 52B, 52C, and 52D. The distal section 58 of the cover body 44 has the adhesive applied portions 52A, 52B, 52C, and 52D. The distal section 58 of the additional walls 50A, 50B, 50C, and 50D has the adhesive applied portions 52A, 52B, 52C, and 52D. The adhesive applied portion 52A is coupled to the adhesive applied portions 52B and 52C. The adhesive applied portion 52B is coupled to the adhesive applied portions 52A and 52D. The adhesive applied portion 52C is coupled to the adhesive applied portions 52A and 52D. The adhesive applied portion 52D is coupled to the adhesive applied portions 52B and 52C. Alternatively, the at least one adhesive applied portion 52 can include a single adhesive applied portion if needed or desired.

The at least one adhesive applied portion 52 defines an adhesive applied region 52R having a closed loop. The adhesive applied portions 52A, 52B, 52C, and 52D define the adhesive applied region 52R. The adhesive 54 is applied to the adhesive applied region 52R when the cover body 44 is attached to the target portion 40.

As seen in FIGS. 7 and 8, the at least one additional wall 50 includes at least one side wall 64 extending from the base wall 48 toward the distal section 58. The at least one side wall 64 includes side walls 64A, 64B, 64C, and 64D. The side walls 64A, 64B, 64C, and 64D extend from the base wall 48 toward the distal section 58.

The side wall 64A is coupled to the side walls 64B and 64C. The side wall 64B is coupled to the side walls 64A and 64D. The side wall 64C is coupled to the side walls 64A and 64D. The side wall 64D is coupled to the side walls 64B and 64C. The side walls 64A, 64B, 64C, and 64D include the interior surface 60 and the exterior surface 62.

In the present embodiment, the side walls 64A, 64B, 64C, and 64D are integrally provided with each other as a one-piece unitary member. The side walls 64A, 64B, 64C, and 64D are integrally provided with the base wall 48 as a one-piece unitary member. Alternatively, at least one of the side walls 64A, 64B, 64C, and 64D can be a separate member from another of the side walls 64A, 64B, 64C, and 64D if needed or desired. At least one of the side walls 64A, 64B, 64C, and 64D can be a separate member from the base wall 48 if needed or desired.

The interior surface 60 includes interior surfaces 60A, 60B, 60C, and 60D. The additional wall 50A includes the interior surface 60A. The additional wall 50B includes the interior surface 60B. The additional wall 50C includes the interior surface 60C. The additional wall 50D includes the interior surface 60D.

The side wall 64A includes the interior surface 60A. The side wall 64B includes the interior surface 60B. The side wall 64C includes the interior surface 60C. The side wall 64D includes the interior surface 60D.

As seen in FIGS. 7 and 8, the distal section 58 of the cover body 44 has at least one first protrusion 66. The distal section 58 of the at least one additional wall 50 has the at least one first protrusion 66. In the present embodiment, the at least one first protrusion 66 includes first protrusions 66A, 66B, 66C, and 66D. The distal section 58 of the additional wall 50A has the first protrusion 66A. The distal section 58 of the additional wall 50B has the first protrusion 66B. The distal section 58 of the additional wall 50C has the first protrusion 66C. The distal section 58 of the additional wall 50D has the first protrusion 66D.

The at least one adhesive applied portion 52 is provided to the at least one first protrusion 66. The adhesive applied portion 52A is provided to the first protrusion 66A. The adhesive applied portion 52B is provided to the first protrusion 66B. The adhesive applied portion 52C is provided to the first protrusion 66C. The adhesive applied portion 52D is provided to the first protrusion 66D.

Figure 9:
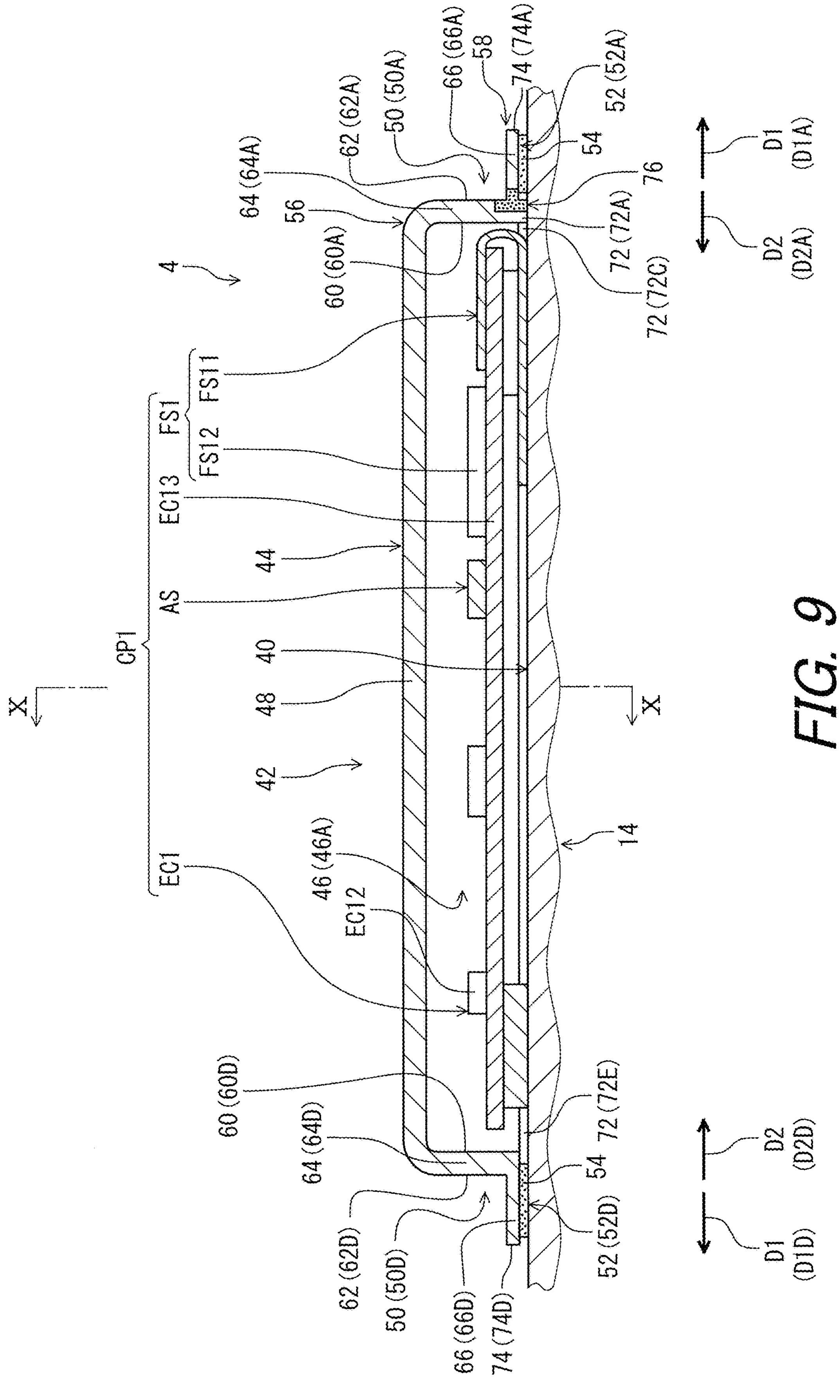
FIG. 9 is a cross-sectional view of the device of the human-powered vehicle taken along line IX-IX of FIG. 10.
Figure 10:
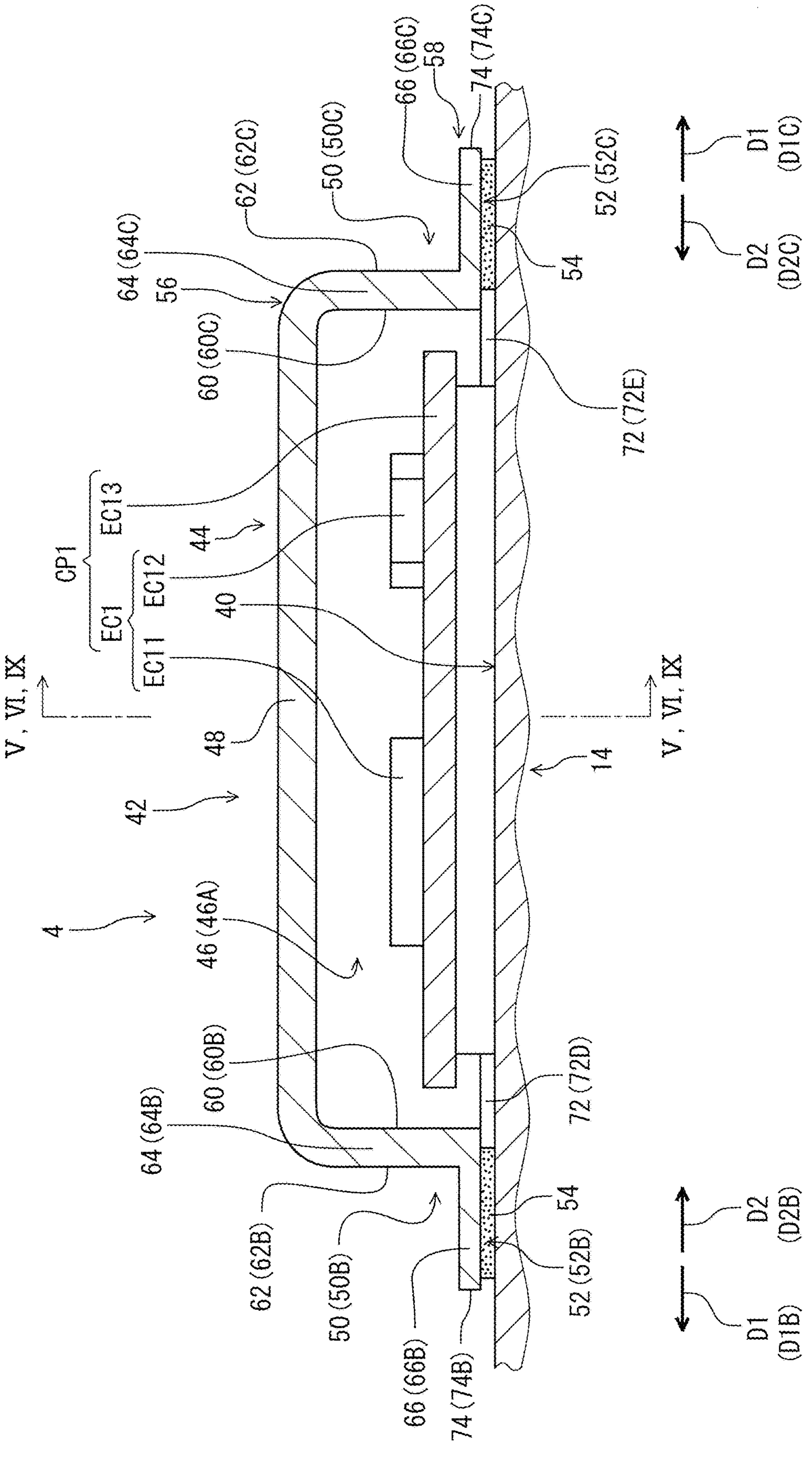
FIG. 10 is a cross-sectional view of the device of the human-powered vehicle taken along line X-X of FIG. 9.

As seen in FIGS. 9 and 10, the exterior surface 62 includes exterior surfaces 62A, 62B, 62C, and 62D. The additional wall 50A includes the exterior surface 62A. The additional wall 50B includes the exterior surface 62B. The additional wall 50C includes the exterior surface 62C. The additional wall 50D includes the exterior surface 62D.

The side wall 64A includes the exterior surface 62A. The side wall 64B includes the exterior surface 62B. The side wall 64C includes the exterior surface 62C. The side wall 64D includes the exterior surface 62D.

The at least one first protrusion 66 extends in at least one of a first direction D1 defined from the interior surface 60 toward the exterior surface 62 and a second direction D2 defined from the exterior surface 62 toward the interior surface 60. In the present embodiment, the at least one first protrusion 66 extends in the first direction D1. The at least one first protrusion 66 extends from the at least one side wall 64 in the first direction D1. Alternatively, the at least one first protrusion 66 can extend from the at least one side wall 64 in the second direction D2 or both the first direction D1 and the second direction D2 if needed or desired.

As seen in FIG. 9, the first protrusion 66A extends in at least one of a first direction D1A defined from the interior surface 60A toward the exterior surface 62A and a second direction D2A defined from the exterior surface 62A toward the interior surface 60A. In the present embodiment, the first protrusion 66A extends from the side wall 64A in the first direction DIA. Alternatively, the first protrusion 66A can extend from the side wall 64A in the second direction D2A or both the first direction DIA and the second direction D2A if needed or desired.

As seen in FIG. 10, the first protrusion 66B extends in at least one of a first direction D1B defined from the interior surface 60B toward the exterior surface 62B and a second direction D2B defined from the exterior surface 62B toward the interior surface 60B. In the present embodiment, the first protrusion 66B extends from the side wall 64B in the first direction DIB. Alternatively, the first protrusion 66B can extend from the side wall 64B in the second direction D2B or both the first direction DIB and the second direction D2B if needed or desired.

The first protrusion 66C extends in at least one of a first direction D1C defined from the interior surface 60C toward the exterior surface 62C and a second direction D2C defined from the exterior surface 62C toward the interior surface 60C. In the present embodiment, the first protrusion 66C extends from the side wall 64C in the first direction D1C. Alternatively, the first protrusion 66C can extend from the side wall 64C in the second direction D2C or both the first direction D1C and the second direction D2C if needed or desired.

As seen in FIG. 9, the first protrusion 66D extends in at least one of a first direction DID defined from the interior surface 60D toward the exterior surface 62D and a second direction D2D defined from the exterior surface 62D toward the interior surface 60D. In the present embodiment, the first protrusion 66D extends from the side wall 64D in the first direction DID. Alternatively, the first protrusion 66D can extend from the side wall 64D in the second direction D2D or both the first direction DID and the second direction D2D if needed or desired.

Figure 26:
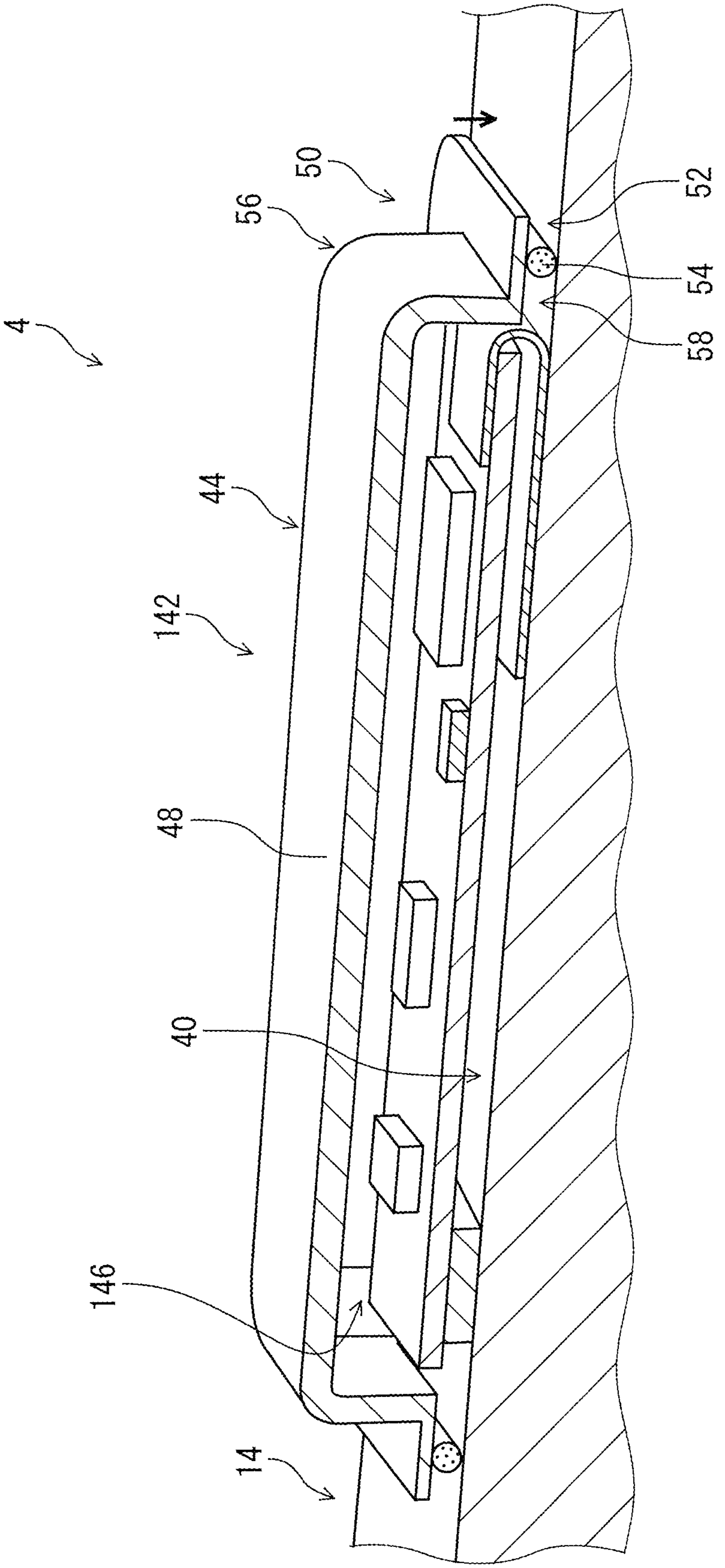
FIG. 26 is a cross-sectional view of a device in accordance with a comparative example.
Figure 27:
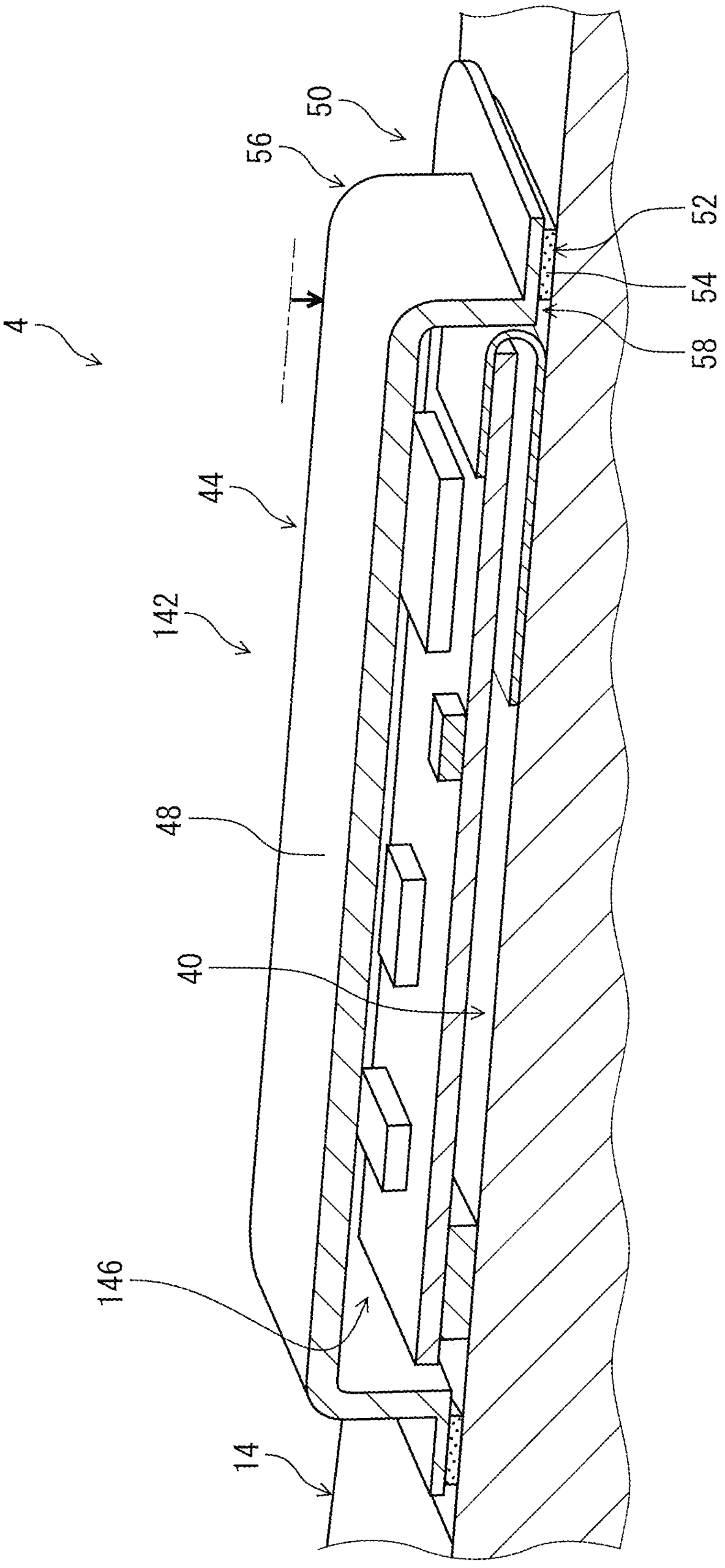
FIG. 27 is a cross-sectional view of the device in accordance with the comparative example.
Figure 28:
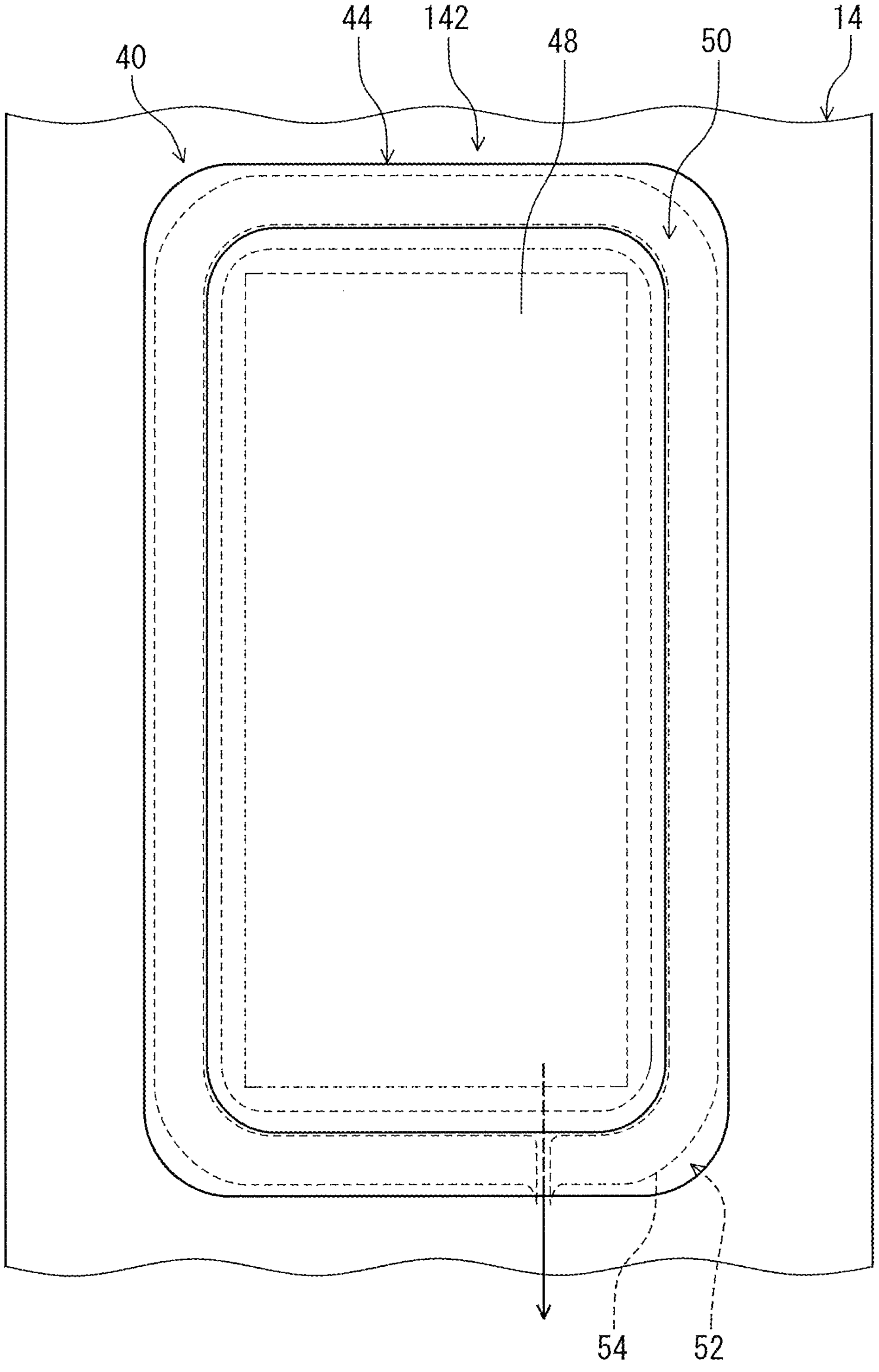
FIG. 28 is a plan view of the device in accordance with the comparative example.

FIGS. 26 and 27 show a cover 142 in accordance with a comparative example. While the cover 142 is being attached to the target portion 40 with the adhesive 54, the adhesive 54 is deformed since the cover 142 is moved towards the target portion 40. Since the adhesive 54 has a closed loop, an inner pressure of an interior cavity 146 of the cover 142 may increase while the cover 142 is being attached to the target portion 40. The increase in the inner pressure may impact the state of the adhesive 54. As seen in FIG. 28, for example, the increased inner pressure pushes the adhesive 54 away from the interior cavity 146, piercing the adhesive 54 having the closed loop. This makes it difficult or impossible to maintain the airtight state of the cover 142.

As seen in FIG. 6, the cover body 44 includes at least one hole 70. The at least one hole 70 is configured to be connected to the at least one interior cavity 46. In the present embodiment, the at least one hole 70 includes a hole 70A. The hole 70A is configured to be connected to the interior cavity 46A. The at least one hole 70 is configured to allow air to flow between the at least one interior cavity 46 and the outside of the cover body 44 while the cover body 44 is being attached to the target portion 40.

The at least one hole 70 is at least partly provided to the at least one first protrusion 66. The hole 70A is at least partly provided to the first protrusion 66A. In the present embodiment, the at least one hole 70 is partly provided to the at least one first protrusion 66. The hole 70A is partly provided to the first protrusion 66A. The hole 70A is partly provided to the side wall 64A.

The at least one hole 70 is disposed closer to the at least one interior cavity 46 than the at least one adhesive applied portion 52. The hole 70A is disposed closer to the interior cavity 46A than the adhesive applied portion 52A.

The at least one hole 70 is provided to the distal section 58 of the at least one additional wall 50 and extends in a third direction D3 defined from the distal section 58 of the at least one additional wall 50 towards the proximal section 56 of the at least one additional wall 50. The hole 70A is provided to the distal section 58 of the additional wall 50A and extends in the third direction D3. Alternatively, the at least one hole 70 can be provided in another position other than the illustrated position in FIG. 6 if needed or desired. For example, the at least one hole 70 can be provided to at least one of the base wall 48 and the additional wall 50A, 50B, 50C, and 50D if needed or desired.

As seen in FIG. 7, the distal section 58 of the at least one additional wall 50 has at least one second protrusion 72. The at least one second protrusion 72 extends in a fourth direction D4 defined from the proximal section 56 of the at least one additional wall 50 towards the distal section 58 of the at least one additional wall 50. The fourth direction D4 is an opposite direction of the third direction D3.

The at least one second protrusion 72 includes a plurality of second protrusions 72A, 72B, 72C, 72D, and 72E. The second protrusions 72A, 72B, 72C, 72D, and 72E are spaced apart from each other. One of the at least one second protrusion 72 is adjacent to the at least one hole 70. The one of the at least one second protrusion 72 at least partly surrounds the at least one hole 70.

Figure 11:
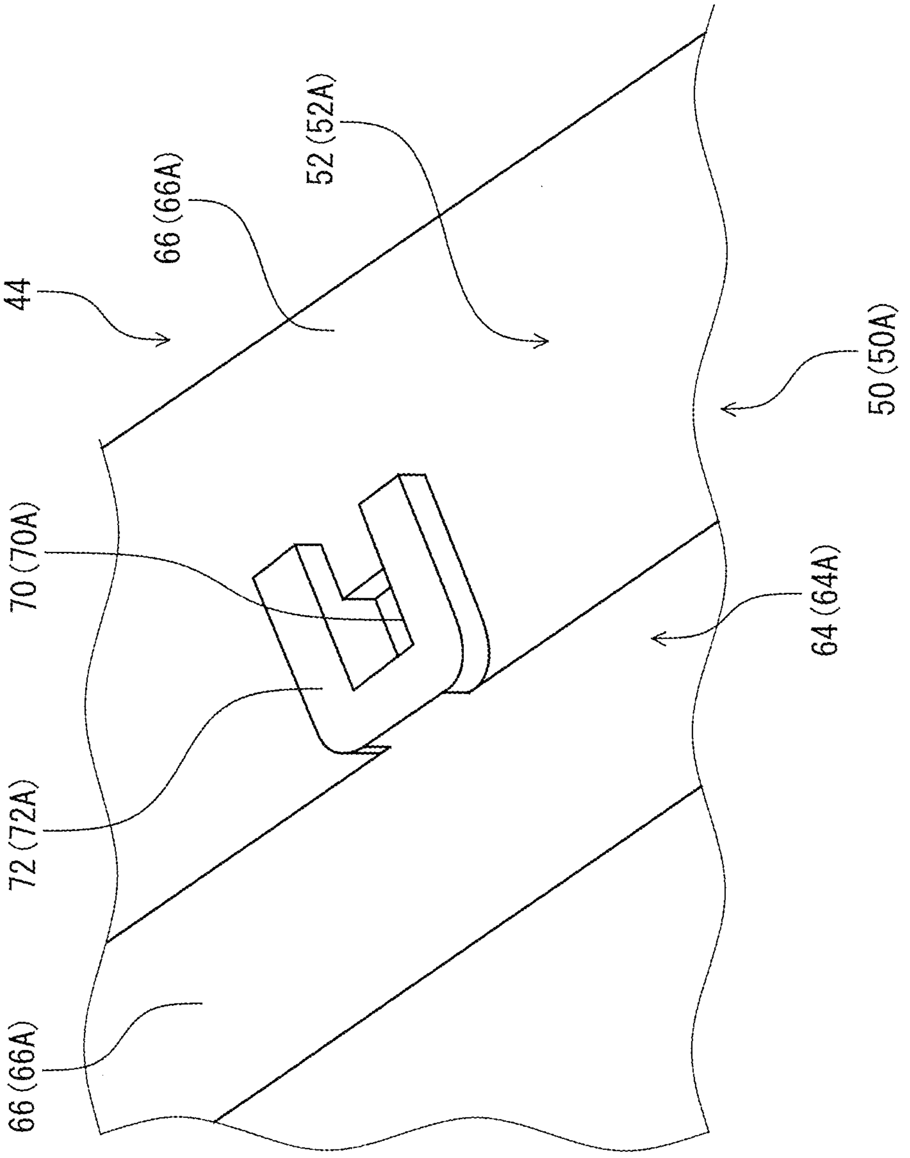
FIG. 11 is a partial perspective view of the cover body of the cover included in the device of the human-powered vehicle illustrated in FIG. 1.

As seen in FIG. 11, in the present embodiment, the second protrusion 72A extends from the additional wall 50A in the fourth direction D4. The second protrusion 72A is adjacent to the hole 70A. The second protrusion 72A partly surrounds the hole 70A.

As seen in FIGS. 7 and 8, the at least one second protrusion 72 is provided on a periphery of the at least one interior cavity 46. The second protrusions 72A, 72B, 72C, 72D, and 72E are provided on the periphery of the at least one interior cavity 46. The second protrusions 72B, 72C, 72D, and 72E extend along the interior surface 60. The second protrusion 72B extends along the interior surfaces 60A and 60B. The second protrusion 72C extends along the interior surfaces 60A and 60C. The second protrusion 72D extends along the interior surfaces 60A and 60D. The second protrusion 72E extends along the interior surfaces 60C and 60D. The second protrusions 72A, 72B, 72C, 72D, and 72E have the same amount of protrusion defined from the at least one additional wall 50 in the third direction D3.

As seen in FIGS. 9 and 10, the at least one second protrusion 72 is in contact with the target portion 40 in the mounting state where the cover 42 is mounted to the target portion 40. The second protrusion 72A is in contact with the target portion 40 in the mounting state. The second protrusion 72B is in contact with the target portion 40 in the mounting state. The second protrusion 72C is in contact with the target portion 40 in the mounting state. The second protrusion 72D is in contact with the target portion 40 in the mounting state. The second protrusion 72E is in contact with the target portion 40 in the mounting state.

The distal section 58 of the at least one additional wall 50 has a most distal end 74. The at least one adhesive applied portion 52 is disposed closer to the proximal section 56 of the at least one additional wall 50 than the most distal end 74. In the present embodiment, the most distal end 74 includes most distal ends 74A, 74B, 74C, and 74D.

As seen in FIG. 9, the additional wall 50A has the most distal end 74A. As seen in FIG. 10, the additional wall 50B has the most distal end 74B. The additional wall 50C has the most distal end 74C. As seen in FIG. 9, the additional wall 50D has the most distal end 74D.

As seen in FIG. 9, the first protrusion 66A includes the most distal end 74A and extends from the side wall 64A to the most distal end 74A in the first direction DIA. The adhesive applied portion 52A is disposed closer to the proximal section 56 of the additional wall 50A than the most distal end 74A.

As seen in FIG. 10, the first protrusion 66B includes the most distal end 74B and extends from the side wall 64B to the most distal end 74B in the first direction DIB. The adhesive applied portion 52B is disposed closer to the proximal section 56 of the additional wall 50B than the most distal end 74B.

As seen in FIG. 10, the first protrusion 66C includes the most distal end 74C and extends from the side wall 64C to the most distal end 74C in the first direction D1C. The adhesive applied portion 52C is disposed closer to the proximal section 56 of the additional wall 50C than the most distal end 74C.

As seen in FIG. 9, the first protrusion 66D includes the most distal end 74D and extends from the side wall 64D to the most distal end 74D in the first direction DID. The adhesive applied portion 52D is disposed closer to the proximal section 56 of the additional wall 50D than the most distal end 74D.

Figure 17:
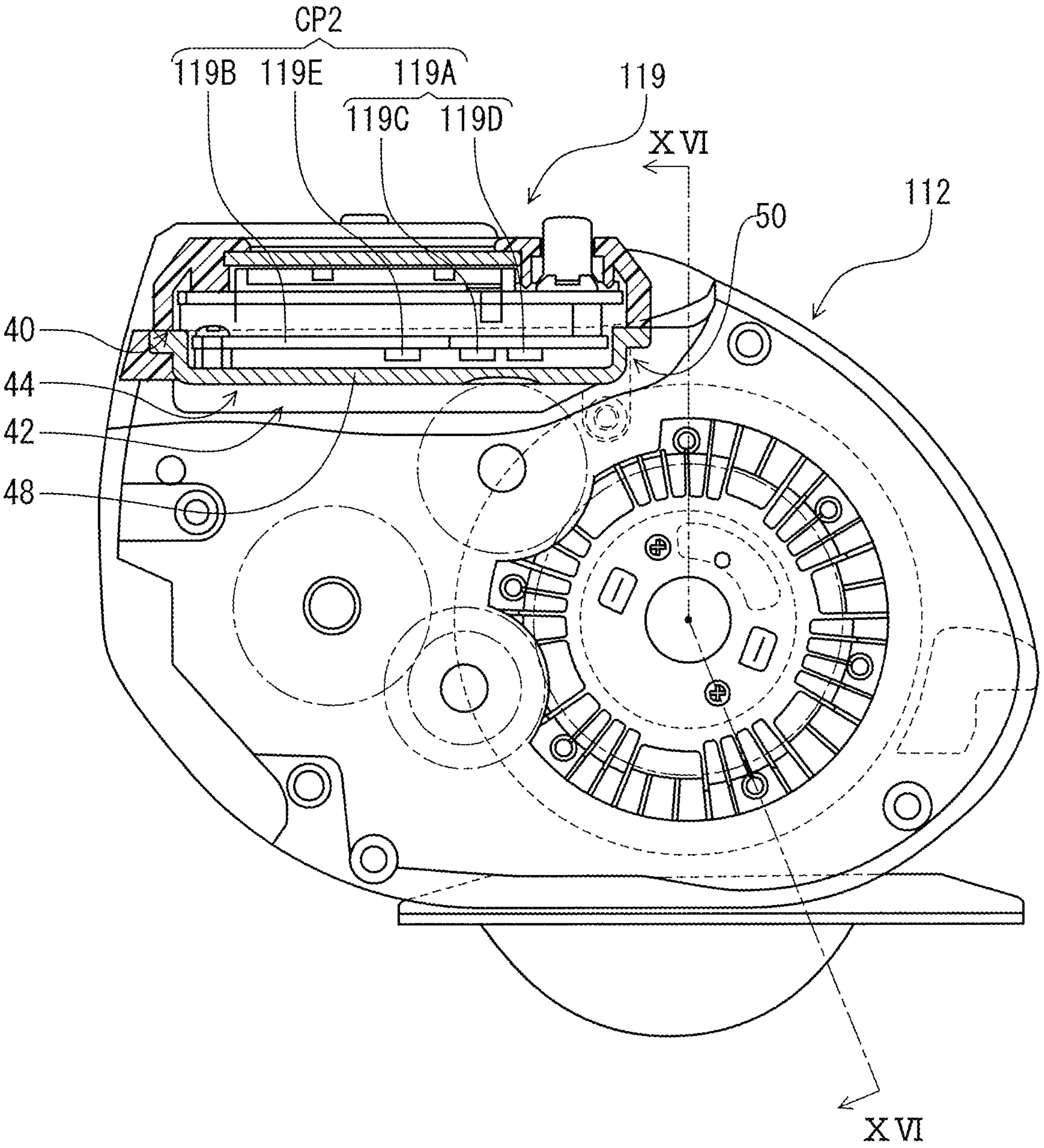
FIG. 17 is a cross-sectional view of the device of the fishing tackle taken along line XVII-XVII of FIG. 16.

As seen in FIGS. 9 and 10, the cover body 44 is configured to cover a component CP1 disposed to at least one of the cover 42 and the target portion 40 of one of the human-powered vehicle 2 and the fishing tackle 102 (see e.g., FIG. 17). In the present embodiment, the component CP1 includes the electrical component EC1, EC13, AS, and/or FS1. The cover body 44 is configured to cover the electrical component EC1, EC13, AS, and/or FS1 disposed to at least one of the cover 42 and the target portion 40 of one of the human-powered vehicle 2 and the fishing tackle 102 (see e.g., FIG. 17).

As seen in FIG. 6, the cover 42 further comprises at least one closing member 76 configured to close the at least one hole 70. The at least one closing member 76 includes at least one filler 76A configured to close the at least one hole 70. The at least one filler 76A is disposed in the at least one hole 70 to close the at least one hole 70. The filler 76A is disposed in the hole 70A to close the hole 70A. Examples of the filler 76A include adhesive and a part (e.g., a pin) which is inserted in the at least one hole 70. Alternatively, the at least one filler 76A can include another material or member if needed or desired.

Figure 12:
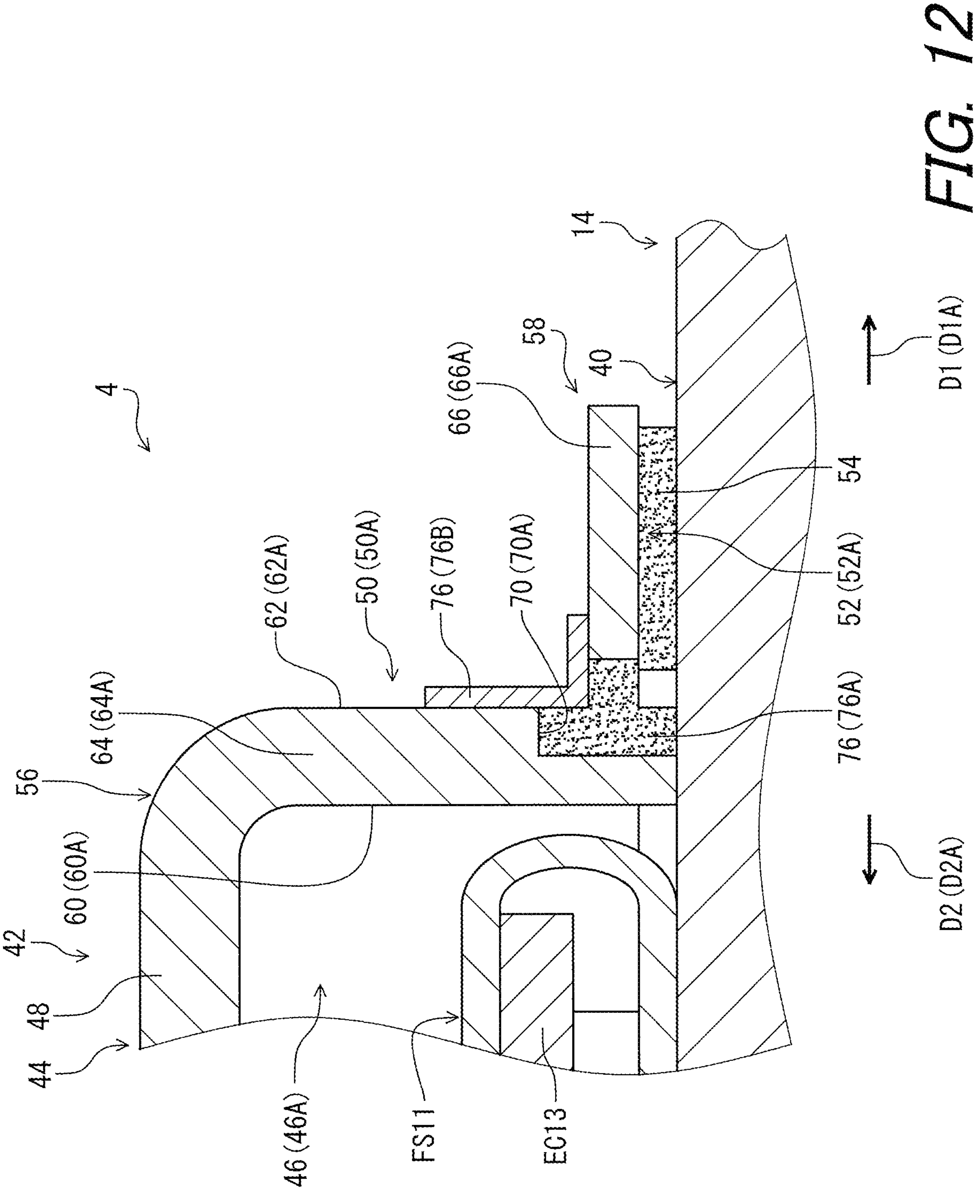
FIG. 12 is a partial cross-sectional view of the device of the human-powered vehicle in accordance with a first modification.
Figure 13:
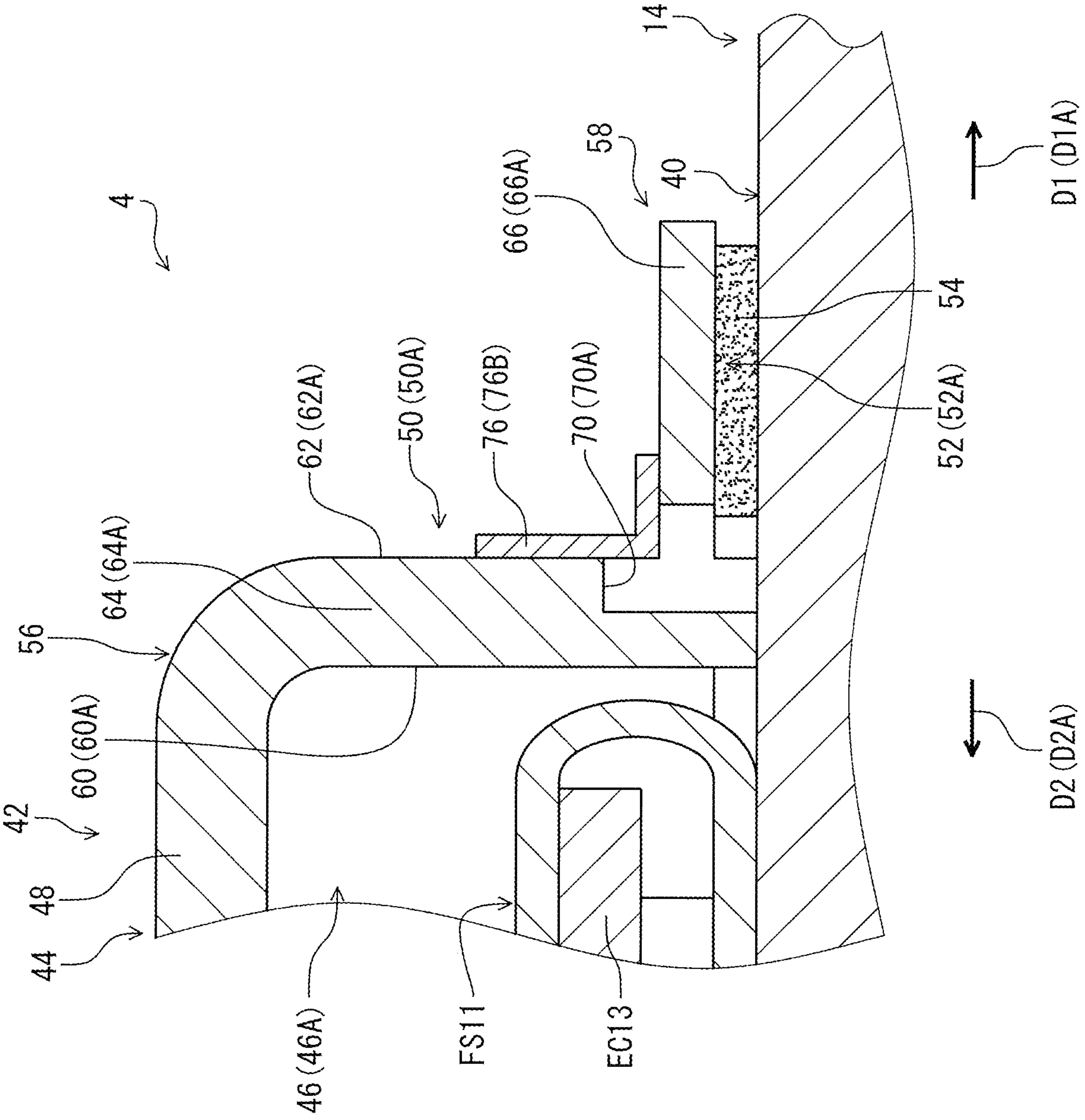
FIG. 13 is a partial cross-sectional view of the device of the human-powered vehicle in accordance with a second modification.
Figure 14:
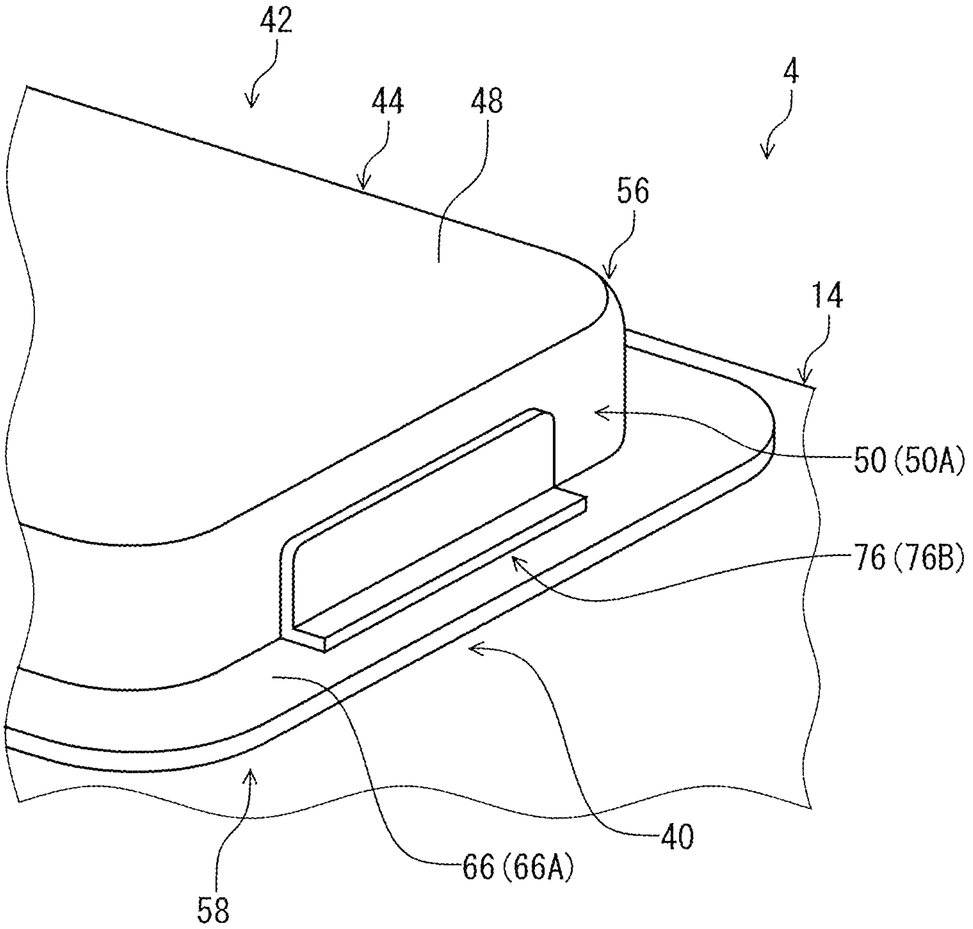
FIG. 14 is a partial perspective view of the device of the human-powered vehicle in accordance with the first or second modification.

As seen in FIGS. 12 to 14, the at least one closing member 76 can include at least one of the at least one filler 76A and at least one attachment member 76B. The at least one attachment member 76B is attached to an outer surface of the cover body 44 to cover the at least one hole 70. The attachment member 76B is attached to the outer surface of the cover body 44 to cover the hole 70A.

As seen in FIG. 12, the at least one closing member 76 includes both the at least one filler 76A and the at least one attachment member 76B. As seen in FIG. 13, the at least one closing member 76 includes the at least one attachment member 76B. The at least one filler 76A is omitted from the cover 42. Examples of the at least one attachment member 76B include an adhesion tape and a plate which is attached to the cover body 44. The at least one attachment member 76B can include another material or member if needed or desired.

As seen in FIG. 15, the fishing reel 110 of the fishing tackle 102 includes a reel body 112, a spool 114, a handle 116, a motor 118, and a control device 119. The fishing reel 110 is an electric reel in which the motor 118 is driven with electric power supplied from an external power source to rotate the spool 114. The spool 114 is rotatably coupled to the reel body 112. The handle 116 is coupled to the reel body 112 to be rotated by the user. The motor 118 is provided in the spool 114. The motor 118 is configured to rotate the spool 114 relative to the reel body 112. For example, the control device 119 is configured to control the motor 118.

Figure 16:
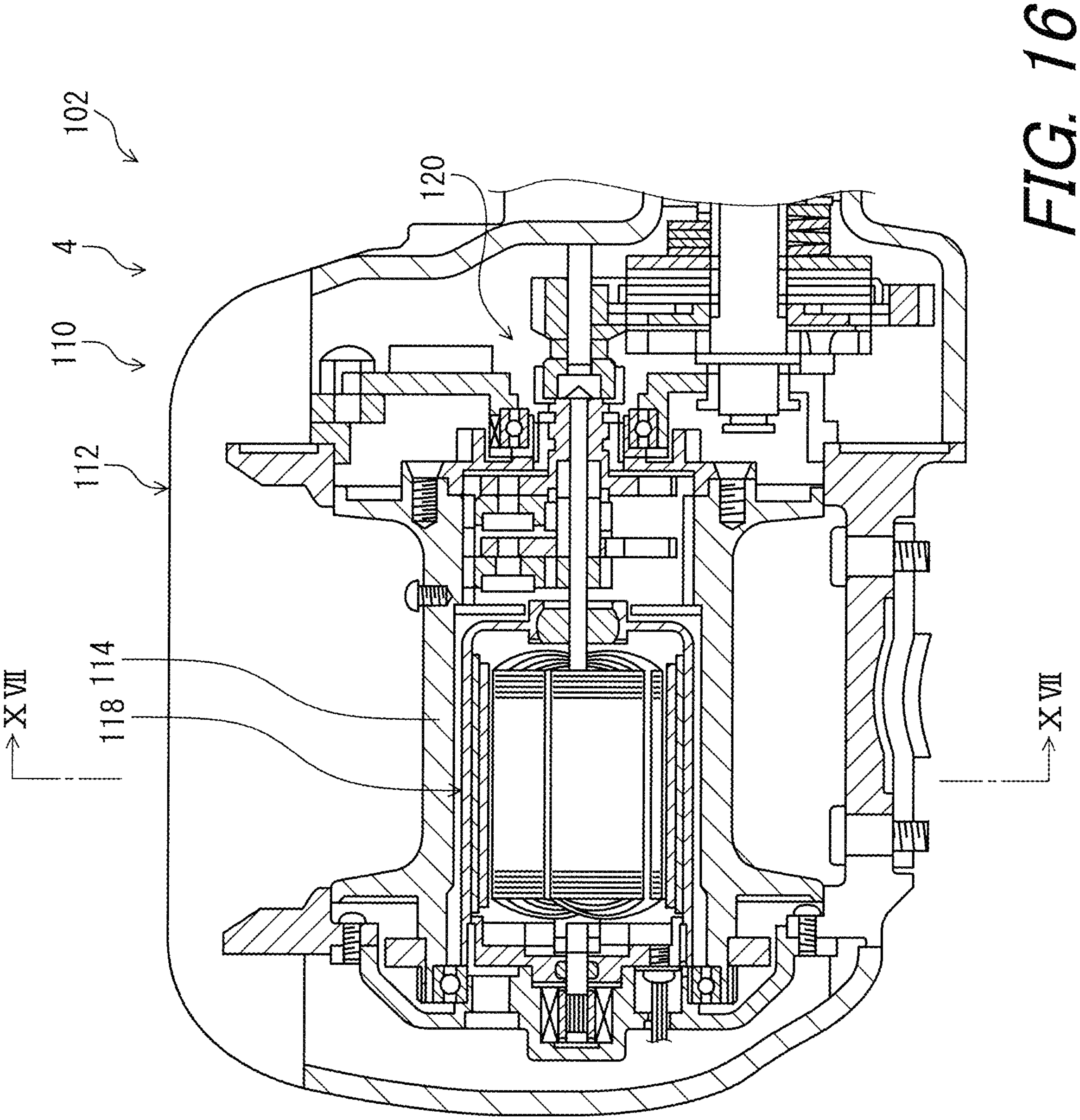
FIG. 16 is a cross-sectional view of the device of the fishing tackle taken along line XVI-XVI of FIG. 17.

As seen in FIG. 16, the fishing reel 110 includes a rotation transmission structure 120. The rotation transmission structure 120 is configured to transmit the rotation of the handle 116 (see e.g., FIG. 15) to the spool 114.

As seen in FIG. 17, the control device 119 includes an electronic controller 119A and a circuit board 119B. The electronic controller 119A is configured to control the motor 118. The electronic controller 119A includes a processor 119C and a memory 119D. The processor 119C and the memory 119D are electrically mounted on the circuit board 119B. The processor 119C has substantially the same structure as the structure of the processor EC11 of the human-powered vehicle 2. The memory 119D has substantially the same structure as the structure of the memory EC12 of the human-powered vehicle 2. The circuit board 119B has substantially the same structure as the structure of the circuit board EC13 of the human-powered vehicle 2. Thus, they will not be described in detail here for the sake of brevity.

The control device 119 includes a motor driver 119E. The motor driver 119E is electrically connected to the motor 118 and the electronic controller 119A via the circuit board 119B. The motor driver 119E is electrically mounted on the circuit board 119B. The electronic controller 119A is configured to control the motor 118 via the motor driver 119E. The electronic controller 119A can also be referred to as an electrical component 119A. The circuit board 119B can also be referred to as an electrical component 119B. The motor driver 119E can also be referred to as an electrical component 119E.

The device 4 of the fishing tackle 102 comprises the target portion 40 and the cover 42. The reel body 112 includes the target portion 40. For example, the circuit board 119B is fastened to the cover 42.

The cover body 44 is configured to cover a component CP2 disposed to at least one of the cover 42 and the target portion 40 of one of the human-powered vehicle 2 and the fishing tackle 102 (see e.g., FIG. 15). In a case where the fishing tackle 102 includes the device 4, the component CP2 includes the electrical component 119A, 119B, and/or 119E. The cover body 44 is configured to cover the electrical component 119A, 119B, and/or 119E disposed to at least one of the cover 42 and the target portion 40 of one of the human-powered vehicle 2 and the fishing tackle 102 (see e.g., FIG. 15).

The description and depictions regarding the cover 42 of the human-powered vehicle 2 can be utilized to describe and/or depict the cover 42 of the fishing tackle 102. Thus, the cover 42 of the fishing tackle 102 will not be described in detail here for the sake of brevity.

The method for mounting the cover 42 to the target portion 40 of one of the human-powered vehicle 2 and the fishing tackle 102 will be described in detail below referring to FIG. 18.

Figure 18:
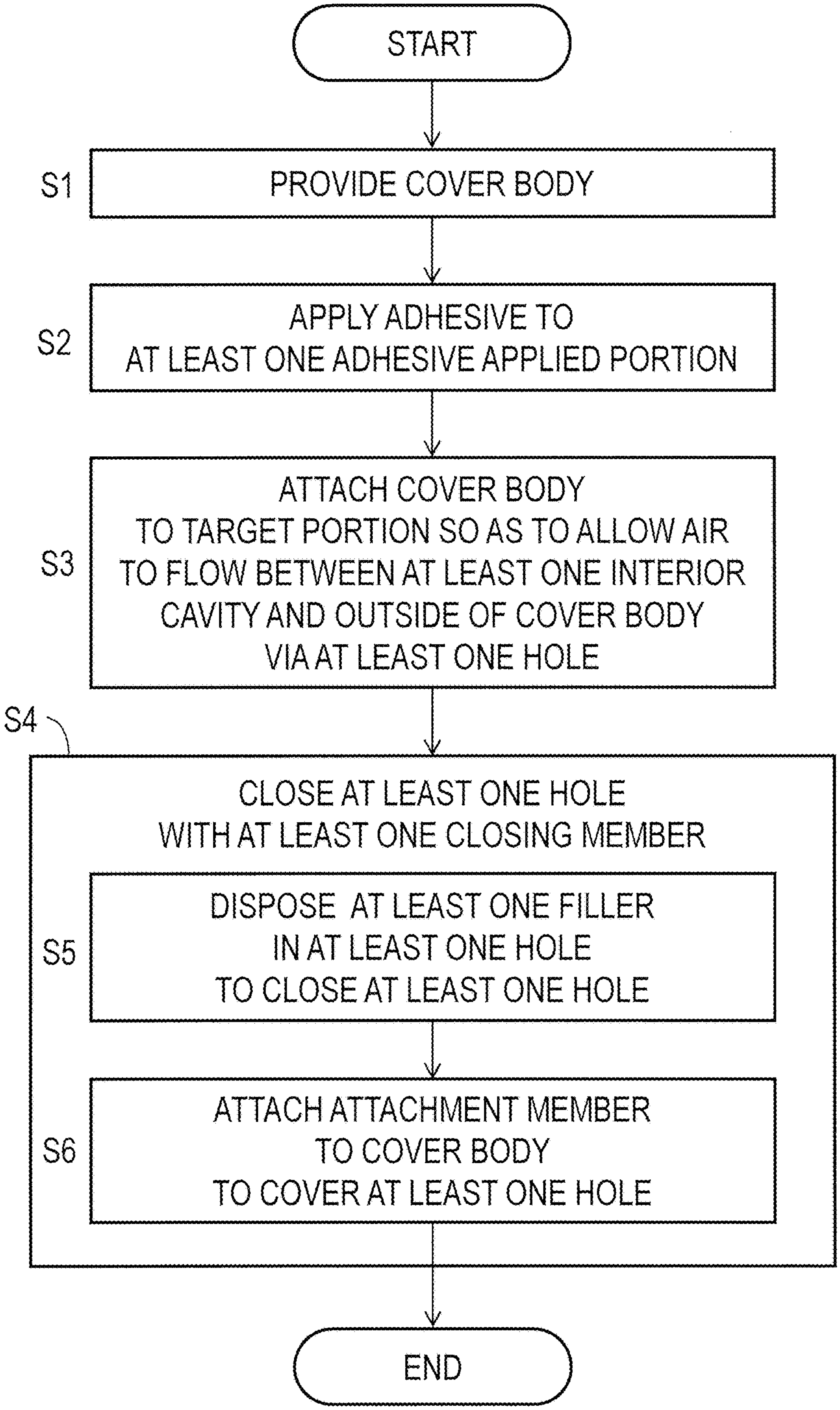
FIG. 18 shows a flowchart of a method for mounting the cover to a target portion of the device.
Figure 19:
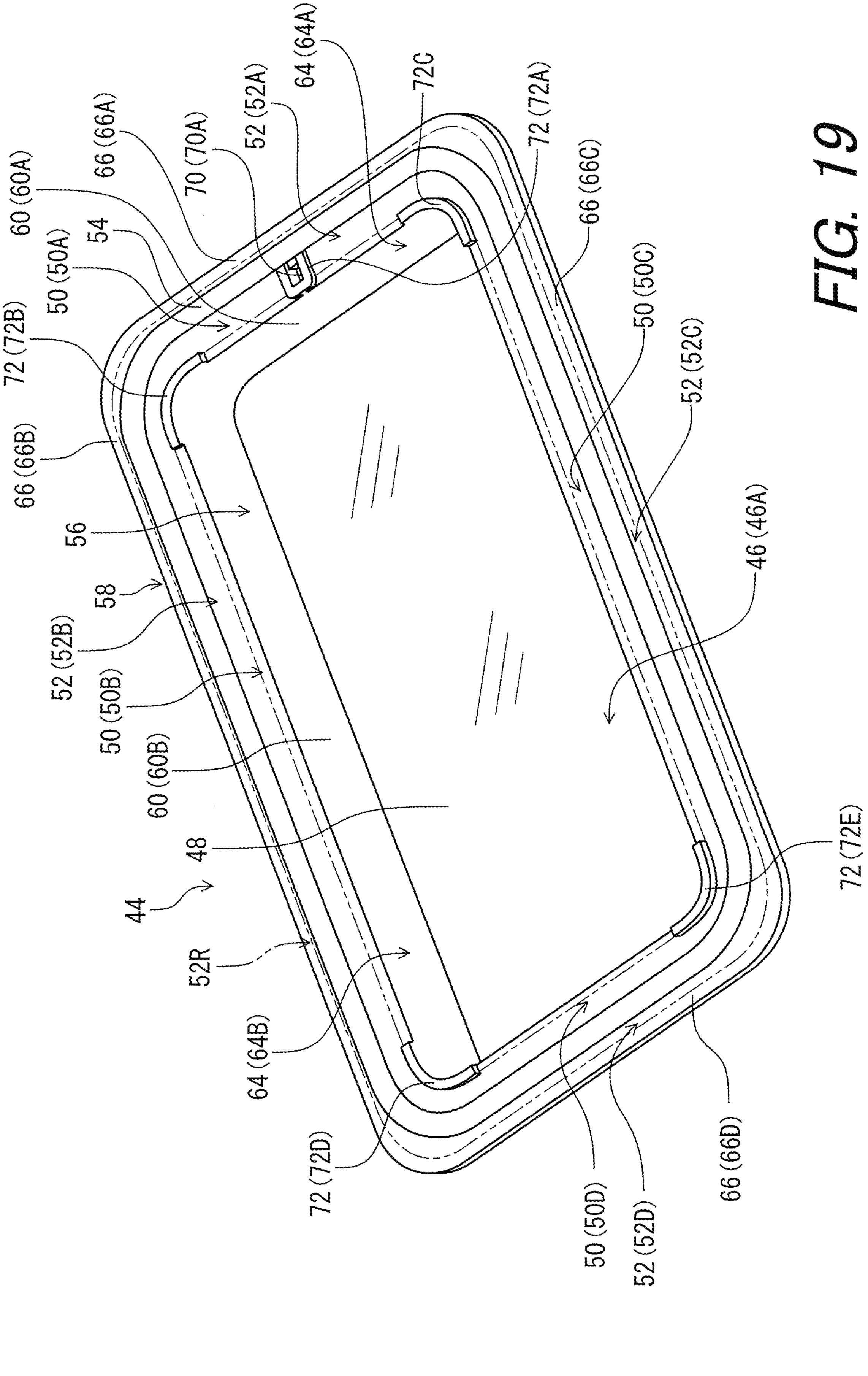
FIG. 19 is a perspective view of the cover body with adhesive applied to at least one adhesive applied portion of the cover body.
Figure 20:
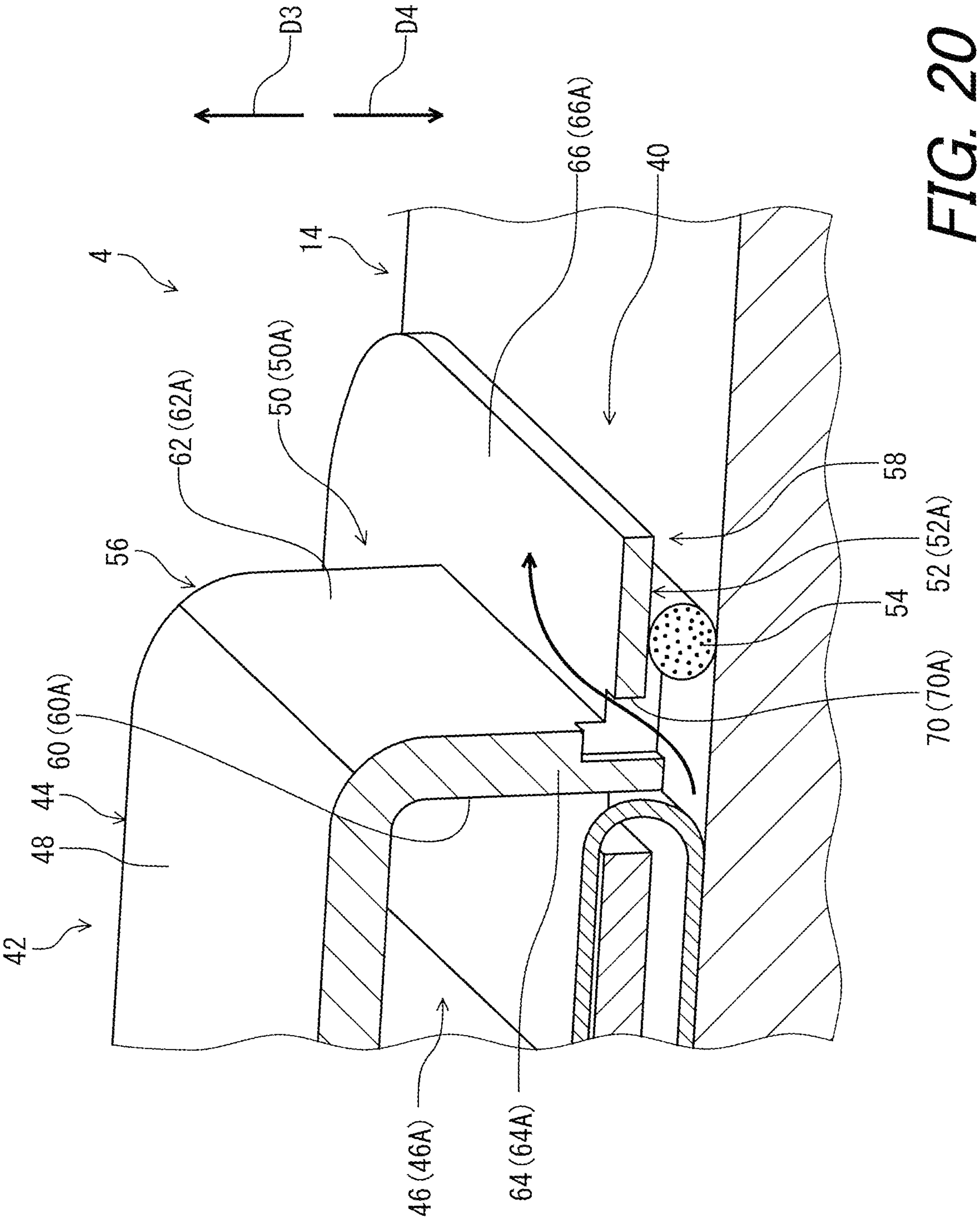
FIG. 20 is a cross-sectional view showing a step in which the cover body is attached to the target portion of the device.
Figure 21:
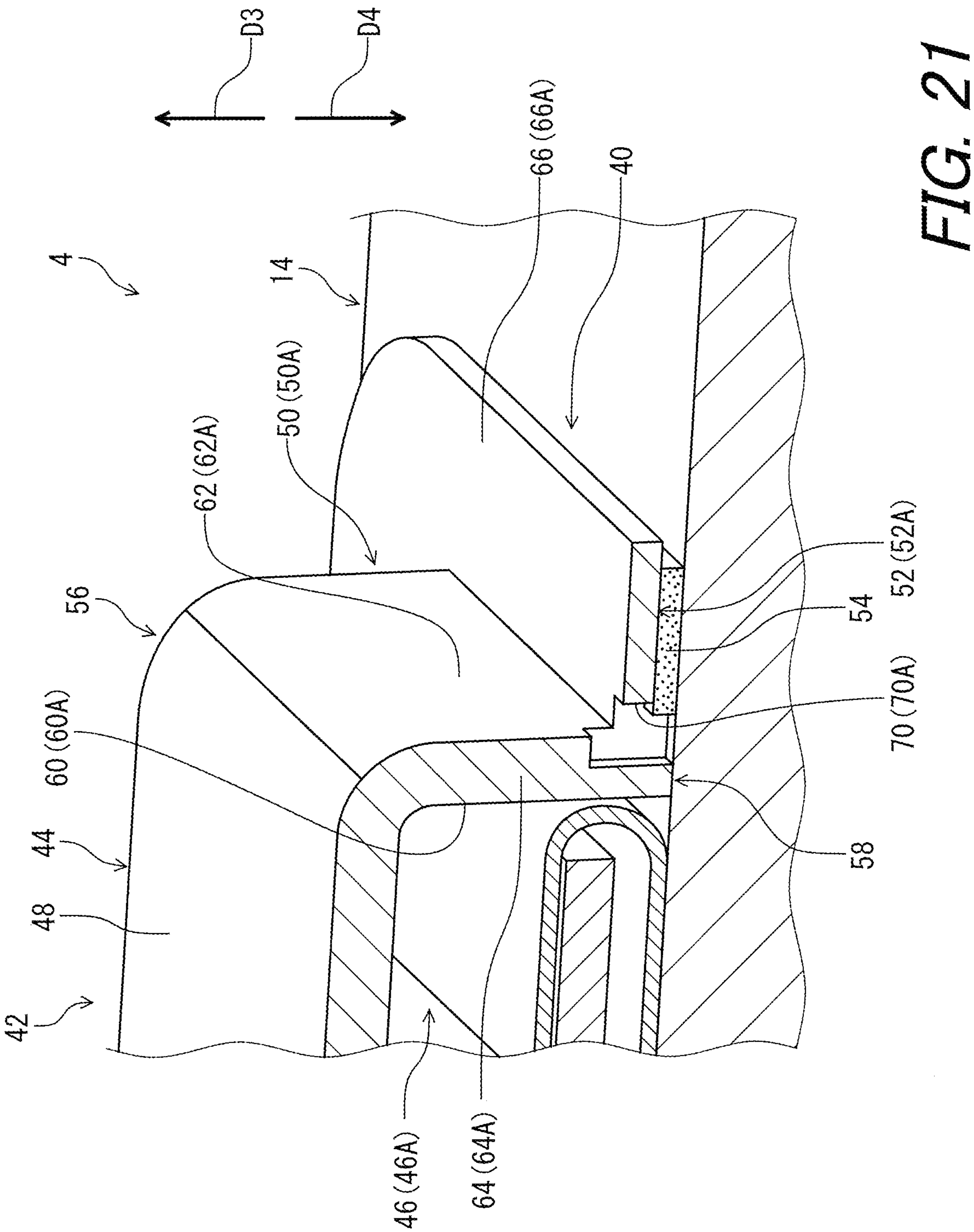
FIG. 21 is a cross-sectional view showing the step in which the cover body is attached to the target portion of the device.

As seen in FIG. 18, the method for mounting the cover 42 to the target portion 40 of one of the human-powered vehicle 2 and the fishing tackle 102 comprises providing the cover body 44 of the cover 42 (step S1). As seen in FIG. 9, for example, the cover body 44 includes the at least one adhesive applied portion 52 and the at least one hole 70. The cover body 44 is configured to define the at least one interior cavity 46. As seen in FIGS. 18 and 19, the method for mounting the cover 42 to the target portion 40 of one of the human-powered vehicle 2 and the fishing tackle 102 comprises applying the adhesive 54 to the at least one adhesive applied portion 52 of the cover body 44 (step S2). As seen in FIGS. 18, 20, and 21, the method for mounting the cover 42 to the target portion 40 of one of the human-powered vehicle 2 and the fishing tackle 102 comprises attaching the cover body 44 to the target portion 40 so as to allow air to flow between the at least one interior cavity 46 and the outside of the cover body 44 via the at least one hole 70 (step S3).

As seen in FIGS. 6, 12, 13, and 18, the method for mounting the cover 42 to the target portion 40 of one of the human-powered vehicle 2 and the fishing tackle 102 comprises closing the at least one hole 70 with the at least one closing member 76 (step S4). The closing of the at least one hole 70 (step S4) includes at least one of: disposing the at least one filler 76A in the at least one hole 70 to close the at least one hole 70 (step S5); and attaching the at least one attachment member 76B to the outer surface of the cover body 44 to cover the at least one hole 70 (step S6). One of steps S5 and S6 can be omitted from step S4.

Figure 22:
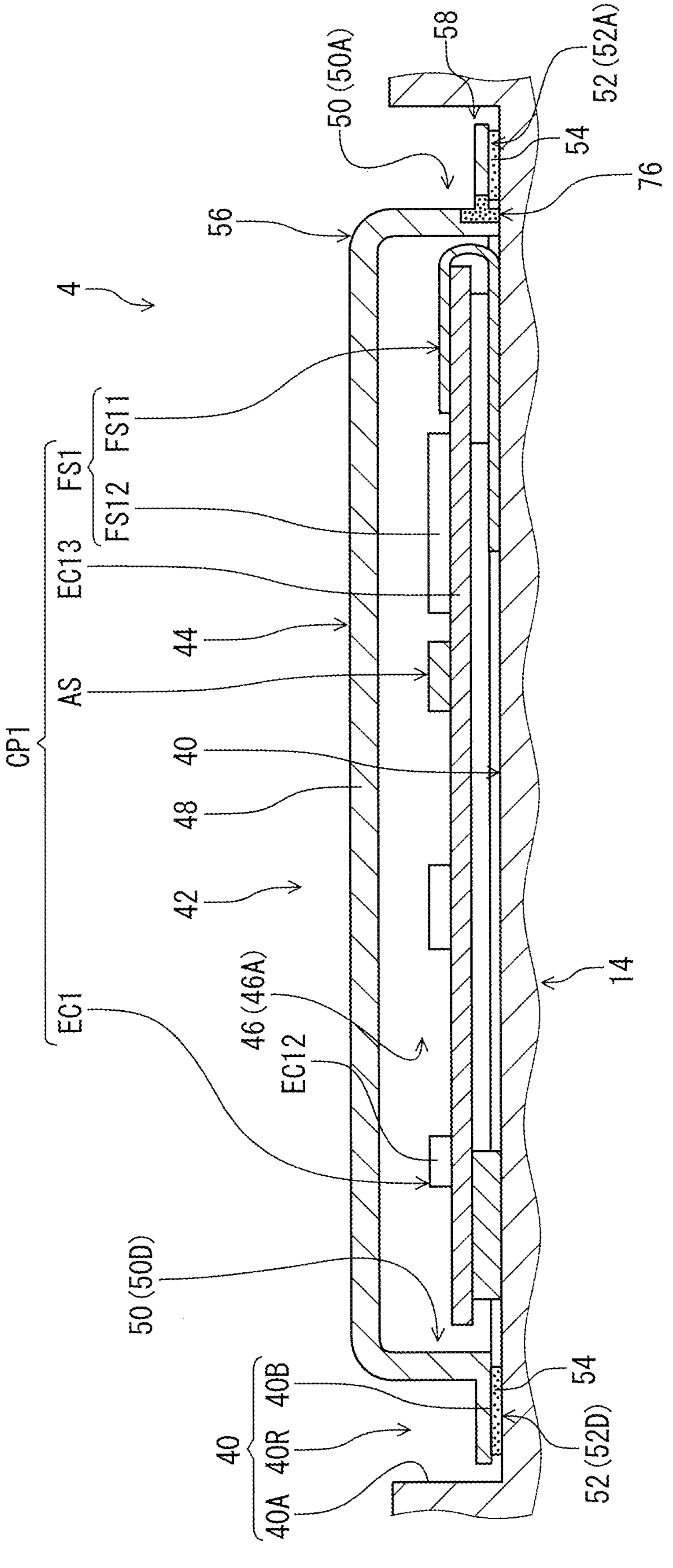
FIG. 22 is a cross-sectional view of a device in accordance with a third modification.

As seen in FIG. 9, the cover 42 is provided on a flat surface of the target portion 40. As seen in FIG. 22, however, the cover 42 can be provided in a recess 40R of the target portion 40 if needed or desired. The target portion 40 includes a side surface 40A and a bottom surface 40B. The side surface 40A extends from the bottom surface 40B. The side surface 40A and the bottom surface 40B define the recess 40R. The cover body 44 is attached to the bottom surface 40B.

Figure 23:
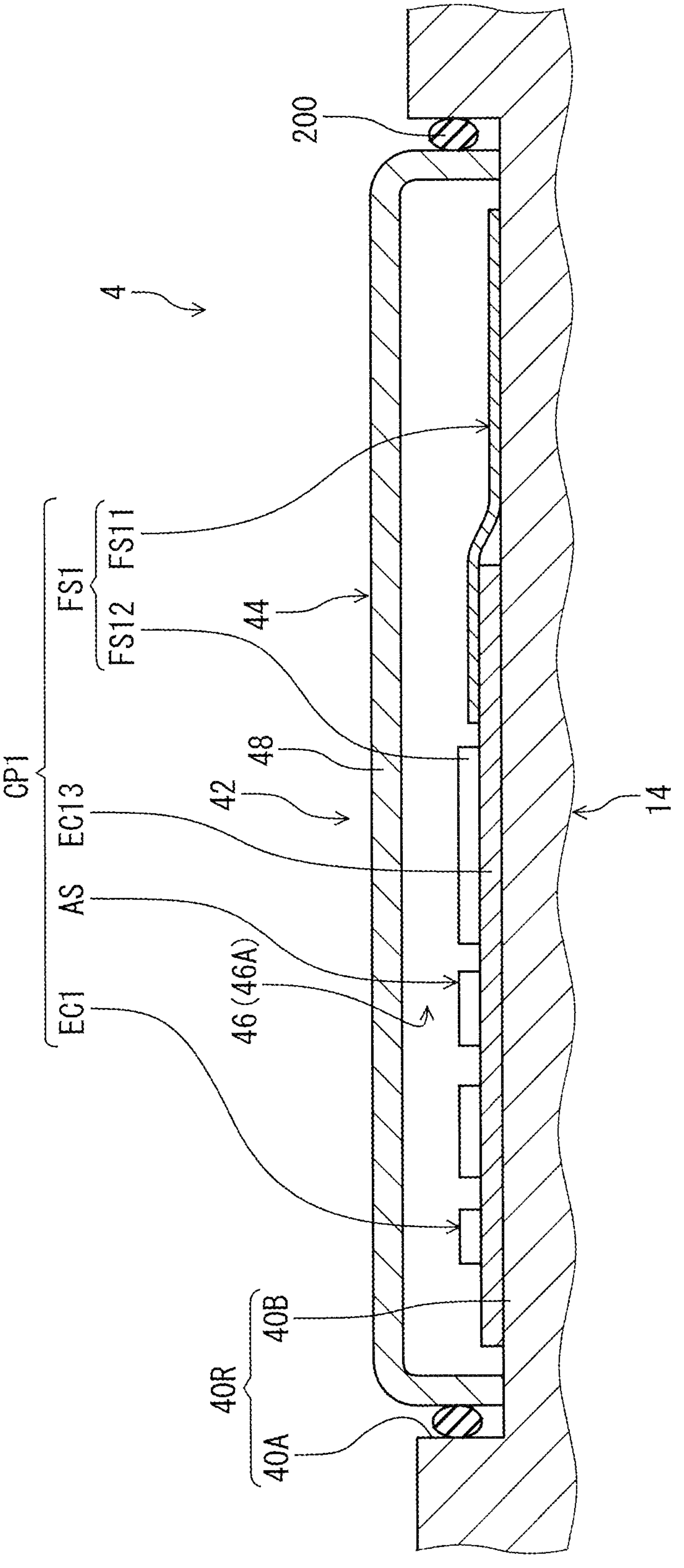
FIG. 23 is a cross-sectional view of a device in accordance with a fourth modification.

As seen in FIG. 23, a seal member 200 can be provided between the target portion 40 and the cover 42 depicted in FIG. 22. The seal member 200 is provided between the side surface 40A and the cover 42. Examples of the seal member 200 include an O-ring. The seal member 200 can include another member other than the O-ring if needed or desired. In this modification, the at least one adhesive applied portion 52 is omitted from the cover 42.

Figure 24:
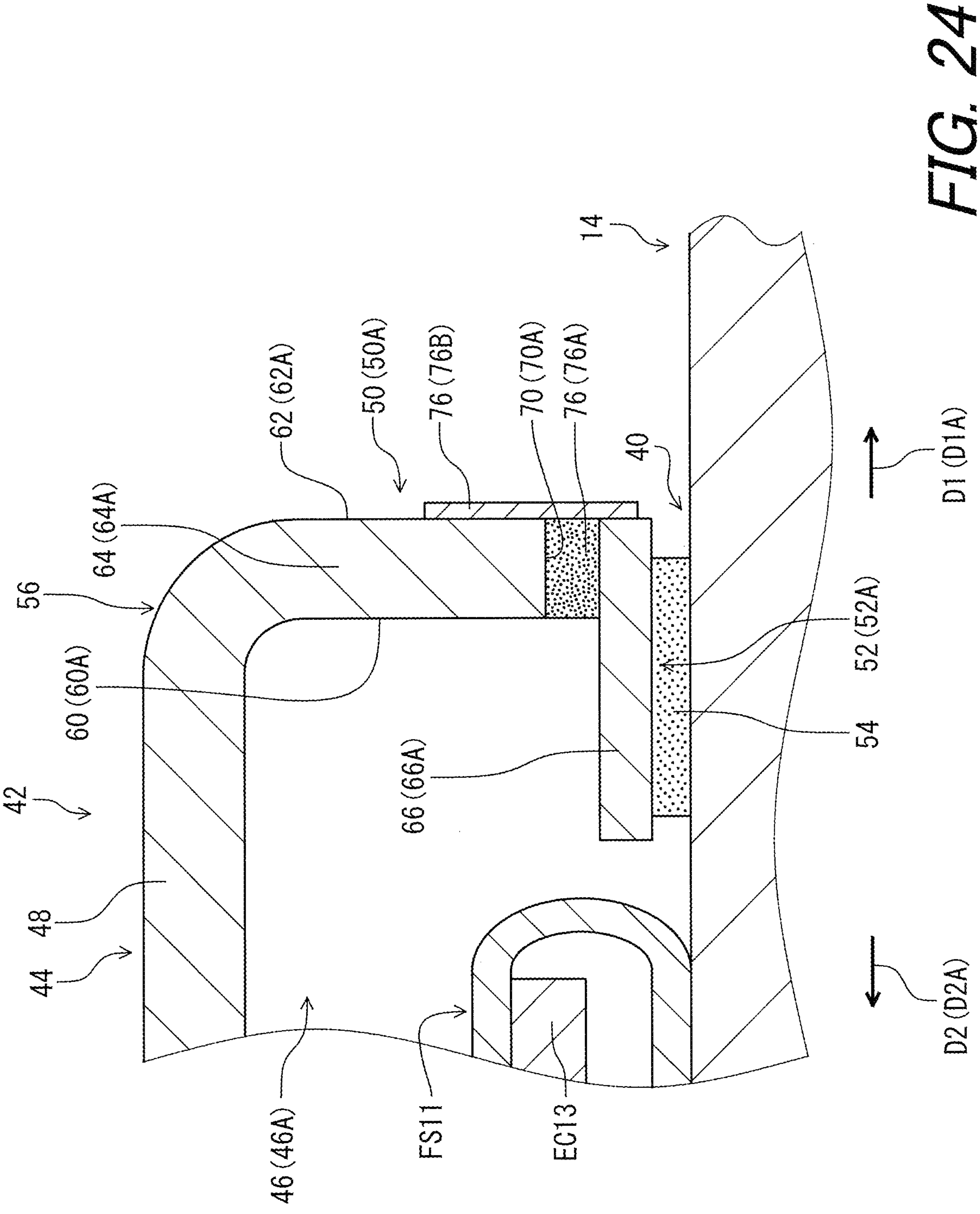
FIG. 24 is a cross-sectional view of a device in accordance with a fifth modification.
Figure 25:
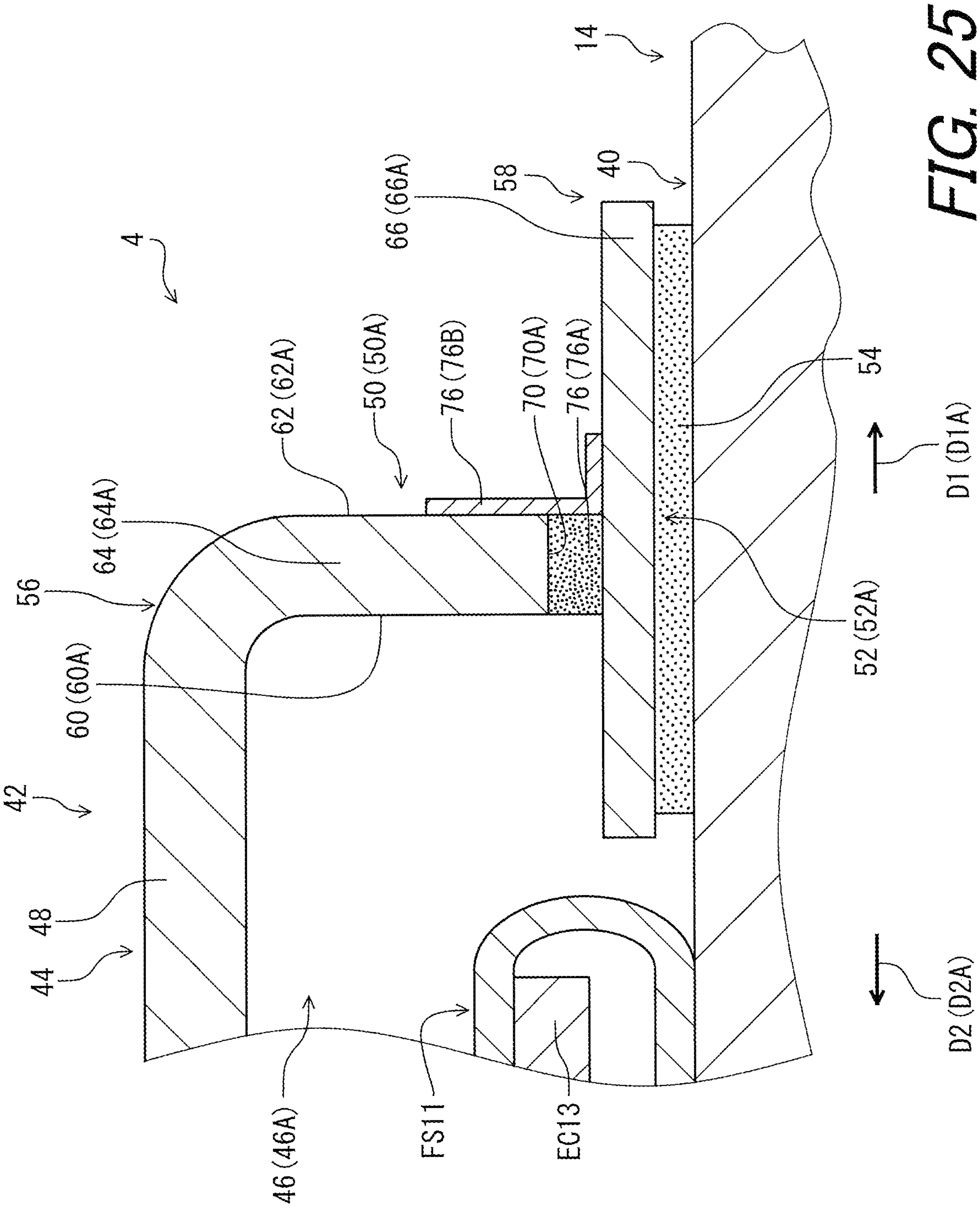
FIG. 25 is a cross-sectional view of a device in accordance with a sixth modification.

As seen in FIGS. 9 and 10, the at least one first protrusion 66 extends from the at least one side wall 64 in the first direction D1. As seen in FIGS. 24 and 25, however, the at least one first protrusion 66 can extend from the at least one side wall 64 in only the second direction D2 or both the first direction D1 and the second direction D2 if needed or desired.

As seen in FIG. 2, the device 4 includes a cover 30B. The cover 30B is mounted to the crank arm 16. As seen in FIG. 3, for example, the cover 30B is configured to cover the sensor FS2 in a state where the cover 30B is mounted to the crank arm 16. The structure of the cover 42 can be applied to the cover 30B.

As seen in FIG. 1, the device 4 includes a cover 30C. The cover 30C is mounted to the crank arm 16. As seen in FIG. 3, for example, the cover 30C is configured to cover the wireless communicator WC1. The structure of the cover 42 can be applied to the cover 30C.

In the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. This concept also applies to words of similar meaning, for example, the terms "have," "include" and their derivatives.

The terms "member," "section," "portion," "part," "element," "body" and "structure" when used in the singular can have the dual meaning of a single part or a plurality of parts.

The ordinal numbers such as "first" and "second" recited in the present application are merely identifiers, but do not have any other meanings, for example, a particular order and the like. Moreover, for example, the term "first element" itself does not imply an existence of "second element," and the term "second element" itself does not imply an existence of "first element."

The term "pair of," as used herein, can encompass the configuration in which the pair of elements have different shapes or structures from each other in addition to the configuration in which the pair of elements have the same shapes or structures as each other.

The terms "a" (or "an"), "one or more" and "at least one" can be used interchangeably herein.

The phrase "at least one of" as used in this disclosure means "one or more" of a desired choice. For one example, the phrase "at least one of" as used in this disclosure means "only one single choice" or "both of two choices" if the number of its choices is two. For other example, the phrase "at least one of" as used in this disclosure means "only one single choice" or "any combination of equal to or more than two choices" if the number of its choices is equal to or more than three. For instance, the phrase "at least one of A and B" encompasses (1) A alone, (2), B alone, and (3) both A and B. The phrase "at least one of A, B, and C" encompasses (1) A alone, (2), B alone, (3) C alone, (4) both A and B, (5) both B and C, (6) both A and C, and (7) all A, B, and C. In other words, the phrase "at least one of A and B" does not mean "at least one of A and at least one of B" in this disclosure.

Finally, terms of degree such as "substantially," "about" and "approximately" as used herein mean a reasonable amount of deviation of the modified term such that the end result is not significantly changed. All of numerical values described in the present application can be construed as including the terms such as "substantially," "about" and "approximately."

Obviously, numerous modifications and variations of the present invention are possible in light of the above teachings. It is therefore to be understood that within the scope of the appended claims, the invention may be practiced otherwise than as specifically described herein.

What is claimed is:

1. A cover comprising:

a cover body configured to be mounted to a target portion of one of a human-powered vehicle and a fishing tackle, the cover body being configured to define at least one interior cavity, the cover body including at least one adhesive applied portion to which adhesive is to be applied, and at least one hole configured to be connected to the at least one interior cavity, the at least one adhesive applied portion defining an adhesive applied region having a closed loop, the cover body including a base wall, and at least one side wall extending from the base wall so that the at least one interior cavity is defined by the base wall and the at least one side wall, the at least one adhesive applied portion extending from the at least one side wall away from the at least one interior cavity, the at least one adhesive applied portion having a flat surface to which the adhesive is to be applied, and the flat surface extending from the at least one side wall away from the at least one interior cavity.

2. The cover according to claim 1, wherein the cover body has a distal section configured to be attached to the target portion of one of the human-powered vehicle and the fishing tackle;

the distal section of the cover body has the at least one adhesive applied portion;

the distal section of the cover body has an interior surface facing toward the at least one interior cavity, and an exterior surface provided on a reverse side of the interior surface; and the distal section of the cover body has at least one first protrusion extending in at least one of a first direction defined from the interior surface toward the exterior surface and a second direction defined from the exterior surface toward the interior surface.

3. The cover according to claim 2, wherein the at least one first protrusion extends in the first direction;

the at least one adhesive applied portion is provided to the at least one first protrusion; and the at least one hole is disposed closer to the at least one interior cavity than the at least one adhesive applied portion.

4. The cover according to claim 2, wherein the at least one first protrusion extends in the first direction; and the at least one hole is at least partly provided to the at least one first protrusion.

5. The cover according to claim 1, wherein the cover body includes at least one additional wall extending from the base wall so that the at least one interior cavity is defined by the base wall and the at least one additional wall, the at least one additional wall including the at least one side wall;

the at least one additional wall has a proximal section and a distal section;

the proximal section of the at least one additional wall is connected to the base wall; and the distal section of the at least one additional wall has the at least one adhesive applied portion.

6. The cover according to claim 5, wherein the at least one additional wall has an interior surface facing toward the at least one interior cavity, and an exterior surface provided on a reverse side of the interior surface; and the distal section of the at least one additional wall has at least one first protrusion extending in at least one of a first direction defined from the interior surface toward the exterior surface and a second direction defined from the exterior surface toward the interior surface.

7. The cover according to claim 6, wherein the at least one first protrusion extends in the first direction;

the at least one adhesive applied portion is provided to the at least one first protrusion; and the at least one hole is disposed closer to the at least one interior cavity than the at least one adhesive applied portion.

8. The cover according to claim 6, wherein the at least one first protrusion extends in the first direction; and the at least one hole is at least partly provided to the at least one first protrusion.

9. The cover according to claim 7, wherein the at least one hole is provided to the distal section of the at least one additional wall and extends in a third direction defined from the distal section of the at least one additional wall towards the proximal section of the at least one additional wall.

10. The cover according to claim 9, wherein the at least one hole is partly provided to the at least one first protrusion.

11. The cover according to claim 5, wherein the distal section of the at least one additional wall has at least one second protrusion extending in a fourth direction defined from the proximal section of the at least one additional wall towards the distal section of the at least one additional wall.

12. The cover according to claim 11, wherein one of the at least one second protrusion is adjacent to the at least one hole.

13. The cover according to claim 12, wherein the one of the at least one second protrusion at least partly surrounds the at least one hole.

14. The cover according to claim 11, wherein the at least one second protrusion includes a plurality of second protrusions.

15. The cover according to claim 5, wherein the distal section of the at least one additional wall has a most distal end; and the at least one adhesive applied portion is disposed closer to the proximal section of the at least one additional wall than the most distal end.

16. The cover according to claim 1, wherein the cover body is configured to cover a component disposed to at least one of the cover and the target portion of one of the human-powered vehicle and the fishing tackle.

17. The cover according to claim 16, wherein the component includes an electrical component, and the cover body is configured to cover the electrical component disposed to at least one of the cover and the target portion of one of the human-powered vehicle and the fishing tackle.

18. The cover according to claim 1, wherein the cover body is configured to be mounted to a crank arm of the human-powered vehicle.

19. The cover according to claim 1, further comprising at least one closing member configured to close the at least one hole.

20. The cover according to claim 19, wherein the at least one closing member includes at least one of at least one filler disposed in the at least one hole to close the at least one hole, and at least one attachment member attached to an outer surface of the cover body to cover the at least one hole.

21. The cover according to claim 1, wherein the at least one hole is disposed closer to the at least one interior cavity than the at least one adhesive applied portion.

22. A device of a human-powered vehicle, comprising:

a target portion; and the cover according to claim 1.

23. A device of a fishing tackle, comprising:

a target portion; and the cover according to claim 1.

* * * * *